(12) United States Patent
Lee et al.

(10) Patent No.: US 8,492,902 B2
(45) Date of Patent: Jul. 23, 2013

(54) MULTI-LAYER TSV INSULATION AND METHODS OF FABRICATING THE SAME

(75) Inventors: Ho-Jin Lee, Seoul (KR); SeYoung Jeong, Suwon-si (KR); Jae-hyun Phee, Incheon (KR); Jung-Hwan Kim, Bucheon-si (KR); Tae Hong Min, Gumi-si (KR)

(73) Assignee: Samsung Electronics Co., Ltd. (KR)

( * ) Notice: Subject to any disclaimer, the term of this patent is extended or adjusted under 35 U.S.C. 154(b) by 203 days.

(21) Appl. No.: 13/049,661

(22) Filed: Mar. 16, 2011

(65) Prior Publication Data

US 2012/0074584 A1    Mar. 29, 2012

(30) Foreign Application Priority Data

Sep. 27, 2010 (KR) .......................... 10-2010-0093420

(51) Int. Cl.
*H01L 23/48* (2006.01)
*H01L 23/52* (2006.01)

(52) U.S. Cl.
USPC .................... 257/774; 257/760; 257/E23.145

(58) Field of Classification Search
USPC ................................... 257/774, 760, E23.145
See application file for complete search history.

(56) References Cited

U.S. PATENT DOCUMENTS

| | | | |
|---|---|---|---|
| 5,229,647 A * | 7/1993 | Gnadinger | 257/785 |
| 8,237,285 B2 * | 8/2012 | Tanida et al. | 257/774 |
| 2004/0061238 A1 * | 4/2004 | Sekine | 257/774 |
| 2006/0001174 A1 * | 1/2006 | Matsui | 257/774 |
| 2006/0148250 A1 * | 7/2006 | Kirby | 438/667 |
| 2006/0180941 A1 * | 8/2006 | Kirby et al. | 257/774 |
| 2007/0138640 A1 * | 6/2007 | Chakrapani et al. | 257/758 |
| 2010/0301485 A1 * | 12/2010 | Sekine et al. | 257/769 |

FOREIGN PATENT DOCUMENTS

| | | |
|---|---|---|
| JP | 2005-026405 | 1/2005 |
| JP | 2009-147060 | 7/2009 |
| KR | 1020070085776 A | 8/2007 |
| KR | 100800161 B1 | 1/2008 |

* cited by examiner

*Primary Examiner* — Nitin Parekh
(74) *Attorney, Agent, or Firm* — Myers Bigel Sibley & Sajovec P.A.

(57) ABSTRACT

Provided is a semiconductor device. The semiconductor device may include a substrate and a stacked insulation layer on a sidewall of an opening which penetrates the substrate. The stacked insulation layer can include at least one first insulation layer and at least one second insulation layer whose dielectric constant is different than that of the first insulation layer. One insulation layer may be a polymer and one insulation layer may be a silicon based insulation layer. The insulation layers may be uniform in thickness or may vary as a distance from the substrate changes.

14 Claims, 32 Drawing Sheets

MULTI-LAYER TSV INSULATION AND METHODS OF FABRICATING THE SAME

CROSS-REFERENCE TO RELATED APPLICATIONS

This U.S. non-provisional patent application claims priority under 35 U.S.C. §119 of Korean Patent Application No. 10-2010-0093420, filed on Sep. 27, 2010, the entire contents of which are hereby incorporated herein by reference.

BACKGROUND

The present disclosure relates to a semiconductor device and a method of fabricating the same, and more particularly, to a semiconductor device having a Through Silicon Via (TSV) and a method of fabricating the same.

The current trend of electronics industry is to manufacture lightweight, small-sized, high-speed, multi-functioned, and high-performance products at a low cost. To achieve this object, a multi-chip stacked package technology or a system in package technology may be used. The multi-chip stacked package technology or the system in a package technology can use a TSV.

According to the multi-chip stacked package technology or the system in a package technology, functions of a plurality of unit semiconductor devices may be performed in a single semiconductor package. The multi-chip stacked package or the system in a package may be a little bit thicker than a typical single chip package. However, since their planar sizes are similar to that of the single chip package, they may be used for small-sized or mobile high-performance products such as cell phones, laptop computers, memory cards, and portable camcorders.

SUMMARY

The present disclosure provides a semiconductor device with improved electric characteristics by including a through silicon via (TSV) structure having a multi-layered insulation layer.

The present disclosure provides a method of fabricating a semiconductor device with improved electric characteristics by including a TSV structure having a multi-layered insulation layer.

The present disclosure also provides a semiconductor package including the semiconductor device.

Embodiments of the inventive concept provide semiconductor devices including a substrate and a stacked insulation layer on a sidewall of an opening which penetrates the substrate, wherein the stacked insulation layer includes at least one first insulation layer and at least one second insulation layer. The second insulation layer may have a dielectric constant lower than that of the first insulation layer, or vice versa, wherein the lower dielectric constant insulation layer may be a polymer and the other insulation layer may be a silicon based dielectric, with one insulation layer being between the sidewall of the opening and the other insulation layer.

In other embodiments of the inventive concept, methods for fabricating a semiconductor device include preparing a substrate, forming a via hole by selectively etching the substrate, forming a first insulation layer containing a polymer to cover a sidewall of the via hole, and forming a second insulation layer containing silicon on the first insulation layer, wherein the first insulation layer has a dielectric constant lower than that of the second insulation layer.

In still other embodiments of the inventive concept, methods for fabricating a semiconductor device include preparing a substrate, forming a via hole exposing a silicon oxide layer at a bottom surface of the via hole by selectively etching the substrate, forming a first insulation layer containing polymer to cover a sidewall of the via hole by etching the silicon oxide layer using CF-based gas, and forming a second insulation layer containing silicon on the first insulation layer to substantially cover the first insulation layer.

In still other embodiments of the inventive concept, methods for fabricating a semiconductor device include preparing a substrate, forming a via hole by selectively etching the substrate, forming a first insulation layer containing silicon along a profile of the via hole, and forming a second insulation layer containing a polymer to cover the first insulation layer by etching the first insulation layer using CF-based gas.

In still other embodiments of the inventive concept, semiconductor packages include a stacked first semiconductor device and second semiconductor device, wherein each of the first and second semiconductor devices includes a substrate, a stacked insulation layer on a sidewall of an opening which penetrates the substrate, and a metal layer which substantially fills the opening provided in the stacked insulation layer. The stacked insulation layer may include at least one first insulation layer and at least one second insulation layer whose dielectric constant is lower than that of the first insulation layer, wherein the second insulation layer may be a polymer and one of the first and second insulation layers is between the sidewall of the opening and the other insulation layer, wherein a first surface of the metal layer of the first semiconductor device faces a second surface of the metal layer of the second semiconductor device.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
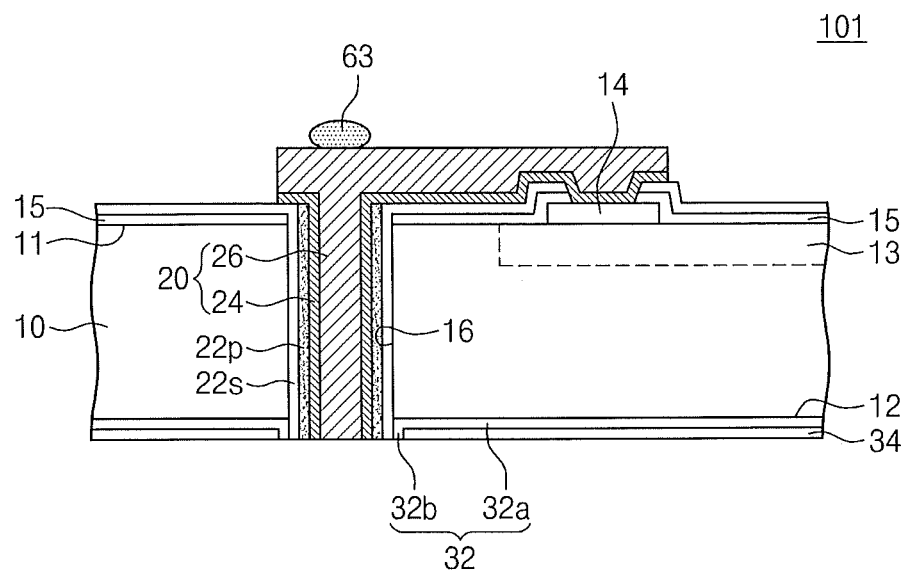
FIG. 1 is a cross-sectional view illustrating a semiconductor device according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

The terms "first", "second", and the like may be used for explaining various elements; however, those elements should not be limited by the terms. The terms are used just for distinguishing one element from another. For instance, without departing the scope of the inventive concept, a first element may be named as a second element, and likewise, the second element may be named as the first element.

The terms of a singular form may include plural forms unless otherwise specified. Also, the meaning of "include," "comprise," "including," or "comprising," specifies a property, a region, a fixed number, a step, a process, an element and/or a component but does not exclude other properties, regions, fixed numbers, steps, processes, elements and/or components.

The terms used for the embodiments of the inventive concept may be interpreted as having the meanings typically known to those skilled in the art, unless they are differently defined. For instance, a low dielectric constant material layer indicates an insulation layer having a dielectric constant lower than that of silicon oxide, silicon nitride, and silicon oxinitride. The term "at least one" is used as having the meaning of one at a minimum and may selectively indicate one or more.

Hereinafter, exemplary embodiments of the inventive concept will be described in detail with reference to the accompanying drawings.

FIG. 1 is a cross-sectional view illustrating a semiconductor device according to an embodiment of the inventive concept. For convenience, a region where a TSV is formed is focused on.

Referring to FIG. 1, a substrate 10 of a semiconductor device 101 includes a first surface 11 and a second surface 12 opposing the first surface 11. The semiconductor device 101 may be a semiconductor chip including an integrated circuit 13. The integrated circuit 13 is provided on the inside of the substrate 10. The integrated circuit 13 may be formed close to the first surface 11 in the substrate 10. The integrated circuit 13 may include a transistor or a memory device, and may be stacked with other circuits.

A pad 14 electrically connected to the integrated circuit 13 may be provided, and may be formed of aluminum (Al) or copper (Cu). Al pads may be provided on the integrated circuit 13, while Cu pads may be part of the integrated circuit 13 as a damascene structure.

The substrate 10 may further include a passivation layer 15 partially exposing the pad 14 on the first surface 11, which may protect the integrated circuit 13 from an external environment and may be formed of silicon oxide, silicon nitride, or their combination.

A via hole 16 for forming a TSV 20 penetrates the substrate 10 and may be separated from the integrated circuit 13. The via hole 16 may be in a region of a peripheral circuit (not illustrated), or a scribe lane, or the via hole 16 may either penetrate or overlap the pad 14.

A via hole insulation layer may be provided on a sidewall of the via hole 16, and may include a first insulation layer 22s and a second insulation layer 22p. The first insulation layer 22s may include silicon oxide, silicon oxinitride, and silicon nitride. The second insulation layer 22p may include a polymer, preferably a CF-based polymer layer, and may be formed through a plasma process using at least one gas selected from $C_4F_6$, $C_4F_8$, $C_5F_8$, and $CHF_3$, and may have a dielectric constant lower than that of the first insulation layer 22s. A CF-based polymer has a dielectric constant of about 2.5 and a silicon oxide layer has a dielectric constant of about 3.6. The first insulation layer 22s may be extended from the sidewall of the via hole 16 onto the passivation layer 15. In this illustrative embodiment, the first insulation layer 22s may expose a part of the pad 14.

The TSV 20 is provided within the via hole 16 and the via hole insulation layers 22s and 22p may extend onto the first surface 11 of the substrate 10 so that the TSV 20 is electrically connected to the pad 14. TSV 20 may include a barrier layer 24 on the via hole insulation layer and a via conductor 26 on the barrier layer 24. The barrier layer 24 may include titanium (Ti), titanium nitride (TiN), tantalum (Ta), and tantalum nitride (TaN), and may serve to prevent conductive material of the via conductor 26 from being diffused into the substrate 10. The via conductor 26 may include silver (Ag), gold (Au), copper (Cu), tungsten (W), and indium (In).

A connector 63 may be provided on the TSV 20, and may be formed using a solder material. The connector 63 may be reflowed when semiconductor devices are stacked so that TSVs of the stacked semiconductor devices may be joined, and may be formed corresponding to a position where the via hole 16 is formed.

First and second sub insulation layers 32 and 34 may be sequentially provided on the second surface 12 of the substrate 10 and may serve to prevent the second surface 12 of the substrate 10 from being contaminated by the conductive material when a process of exposing the via conductor 26 is performed. The first sub insulation layer 32 may be a silicon oxide layer, and the second sub insulation layer 34 may be a silicon nitride layer. The first sub insulation layer 32 is provided directly on the second surface 12 of the substrate 10, and the second sub insulation layer 34 is provided directly on the first sub insulation layer 32.

The first sub insulation layer 32 may include a first part 32a provided on the second surface 12 of the substrate 10 and a second part 32b protruding from the second surface 12 of the substrate 10. That is, the first sub insulation layer 32 may have a cross section having an L shape.

The first and second sub insulation layers 32 and 34 expose the TSV 20 and the via hole insulation layer. The TSV 20 may be exposed by planarizing the substrate 10 using the second sub insulation layer 34 as a planarization stop layer. Accordingly, the second sub insulation layer 34, the via hole insulation layer, and the TSV 20 may have aligned surfaces.

By exposing the TSV 20 through the planarization process using the second sub insulation layer 34 as the planarization stop layer, a photolithography process for removing insulation layers on the TSV 20 may be omitted. When the TSV 20 is exposed using the photolithography process, if the TSV 20 has a narrow width (i.e., if the via hole 16 has a narrow width), the elimination of the first and second sub insulation layers 32 and 34 may not be easy due to a resolution limit of the photolithography process. According to the inventive concept, the TSV 20 may be easily exposed regardless of the width of the TSV 20.

Hereinafter, referring to FIGS. 2 to 10, semiconductor devices according to other embodiments of the inventive concept will be described. FIGS. 2 to 10 are cross-sectional views respectively illustrating the semiconductor devices according to the other embodiments of the inventive concept. For convenience, the region where the TSV is formed is focused on. For the structural elements already explained through the above-described embodiment of the inventive concept, the same reference numerals are used and descriptions for them are omitted.

Figure 2:
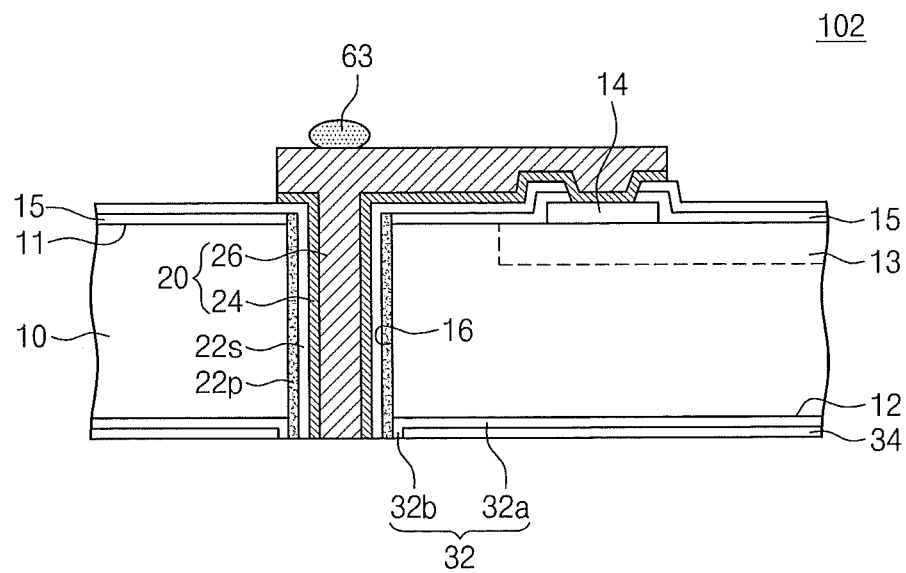
FIG. 2 is a cross-sectional view illustrating a semiconductor device according to another embodiment of the inventive concept.

A difference between a semiconductor device 102 according to another embodiment of the inventive concept illustrated in FIG. 2 and the above-described semiconductor device 101 may include the via hole insulation layer having a different structure.

The via hole insulation layer on the sidewall of the via hole 16 may include a first insulation layer 22p and a second insulation layer 22s on the first insulation layer 22p. The first insulation layer 22p may include the polymer, preferably a CF-based polymer layer, which may be formed through a plasma process using at least one gas selected from $C_4F_6$, $C_4F_8$, $C_5F_8$, and $CHF_3$. The second insulation layer 22s may include silicon oxide, silicon oxinitride, and silicon nitride. The second insulation layer 22s may extend from the sidewall of the via hole 16 onto the passivation layer 15, and the second insulation layer 22s may expose part of the pad 14.

Figure 3:
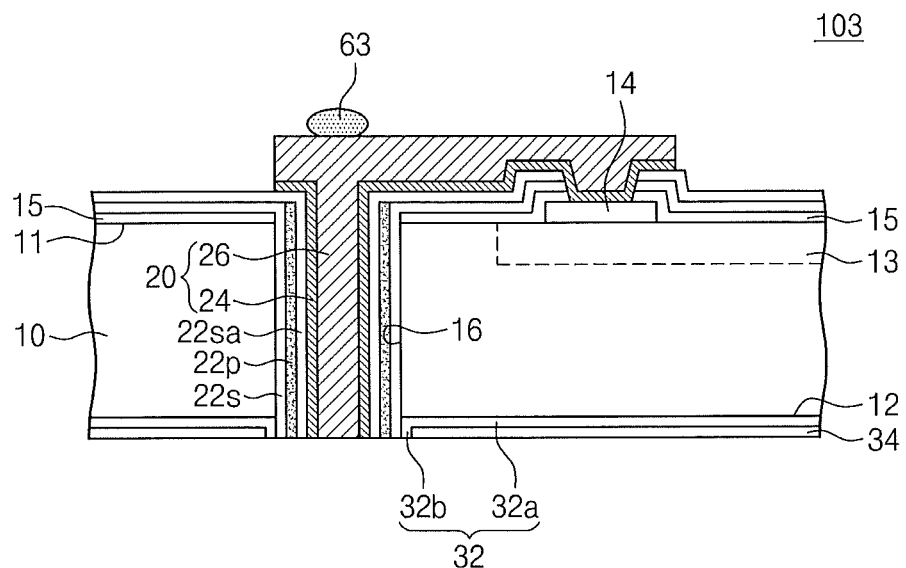
FIG. 3 is a cross-sectional view illustrating a semiconductor device according to still another embodiment of the inventive concept.

A difference between a semiconductor device 103 according to still another embodiment of the inventive concept illustrated in FIG. 3 and the above-described semiconductor device 101 may include the via hole insulation layer having a different structure.

The via hole insulation layer on the sidewall of the via hole 16 may include sequentially stacked first insulation layer 22s, second insulation layer 22p, and third insulation layer 22sa. The first and third insulation layers 22s and 22sa may include silicon oxide, silicon oxinitride, and silicon nitride, preferably a silicon oxide layer. The second insulation layer 22p may include a polymer, preferably a CF-based polymer. The second insulation layer 22p may be formed through a plasma process using at least one gas selected from $C_4F_6$, $C_4F_8$, $C_5F_8$, and $CHF_3$. The first and third insulation layers 22s and 22sa may extend from the sidewall of the via hole 16 onto the passivation layer 15, and may expose part of the pad 14. A fourth insulation layer (not illustrated) including the polymer may be further provided on the third insulation layer 22sa.

Figure 4:
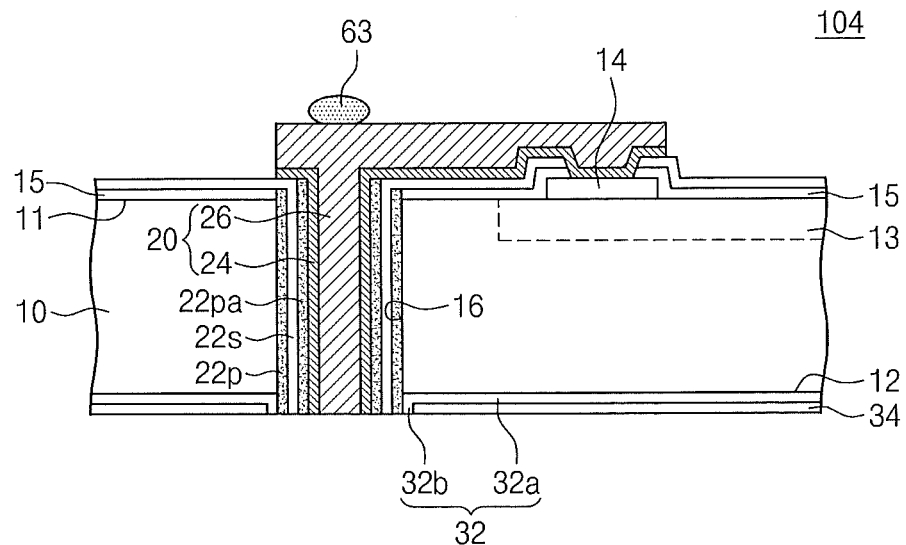
FIG. 4 is a cross-sectional view illustrating a semiconductor device according to still another embodiment of the inventive concept.

A difference between a semiconductor device 104 according to still another embodiment of the inventive concept illustrated in FIG. 4 and the above-described semiconductor device 101 may include the via hole insulation layer having a different structure. The via hole insulation layer provided to the sidewall of the via hole 16 may include sequentially stacked first insulation layer 22p, second insulation layer 22s, and third insulation layer 22pa. The first and third insulation layers 22p and 22pa may include a polymer. The second insulation layer 22s may include silicon oxide, silicon oxinitride, and silicon nitride, preferably a silicon oxide layer, which may extend from the sidewall of the via hole 16 onto the passivation layer 15. A fourth insulation layer (not illustrated) including the silicon may be further provided on the third insulation layer 22pa.

Figure 5:
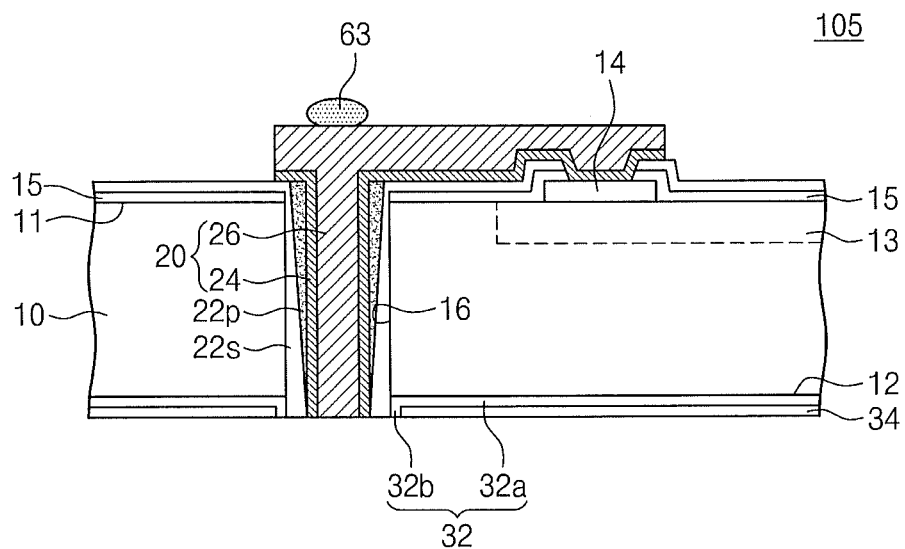
FIG. 5 is a cross-sectional view illustrating a semiconductor device according to still another embodiment of the inventive concept.

A difference between a semiconductor device 105 according to still another embodiment of the inventive concept illustrated in FIG. 5 and the above-described semiconductor device 101 may include the via hole insulation layer having a different structure, and may include a first insulation layer 22s and a second insulation layer 22p on the first insulation layer 22s. The first insulation layer 22s may include silicon oxide, silicon oxinitride, and silicon nitride, and preferably may be a silicon oxide layer. The first insulation layer 22s may have a larger thickness at a lower part of the via hole 16 than at an upper part of the via hole 16. The second insulation layer 22p may include a polymer. The second insulation layer 22s may have a smaller thickness at a lower part of the via hole 16 than at an upper part of the via hole 16. The first insulation layer 22s may extend from the sidewall of the via hole 16 onto the passivation layer 15 and may expose part of pad 14.

Figure 6:
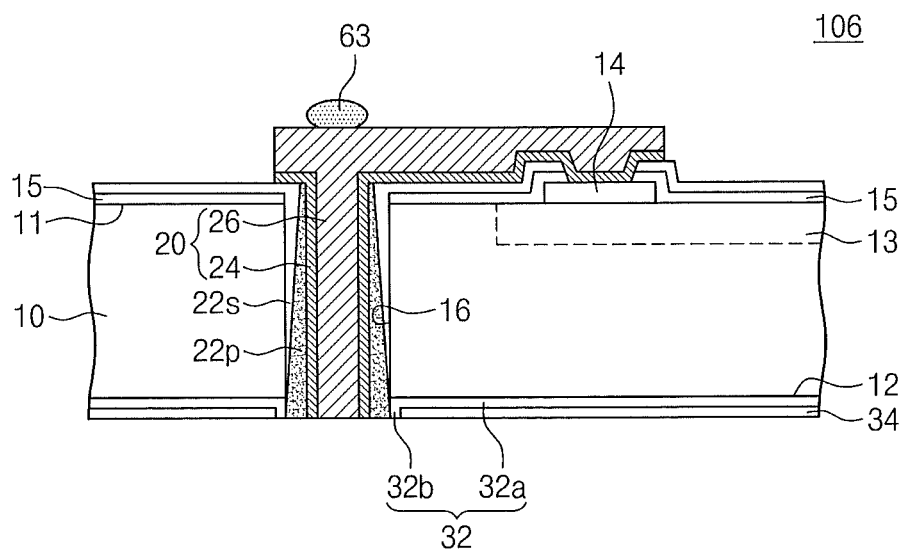
FIG. 6 is a cross-sectional view illustrating a semiconductor device according to still another embodiment of the inventive concept.

A difference between a semiconductor device 106 according to still another embodiment of the inventive concept illustrated in FIG. 6 and the above-described semiconductor device 101 may include the via hole insulation layer having a different structure, which may include a first insulation layer 22s and a second insulation layer 22p on the first insulation layer 22s. The first insulation layer 22s may have a smaller thickness at a lower part of the via hole 16 than at an upper part of the via hole 16. The second insulation layer 22p may include a polymer. The second insulation layer 22s may have a larger thickness at a lower part of the via hole 16 than at an upper part of the via hole 16. The first insulation layer 22s may extend from the sidewall of the via hole 16 onto the passivation layer 15, and may expose part of the pad 14.

In other embodiments, the first and second insulation layers 22s or 22p in the via hole insulation layer may not cover the whole sidewall of the via hole 16.

Figure 7:
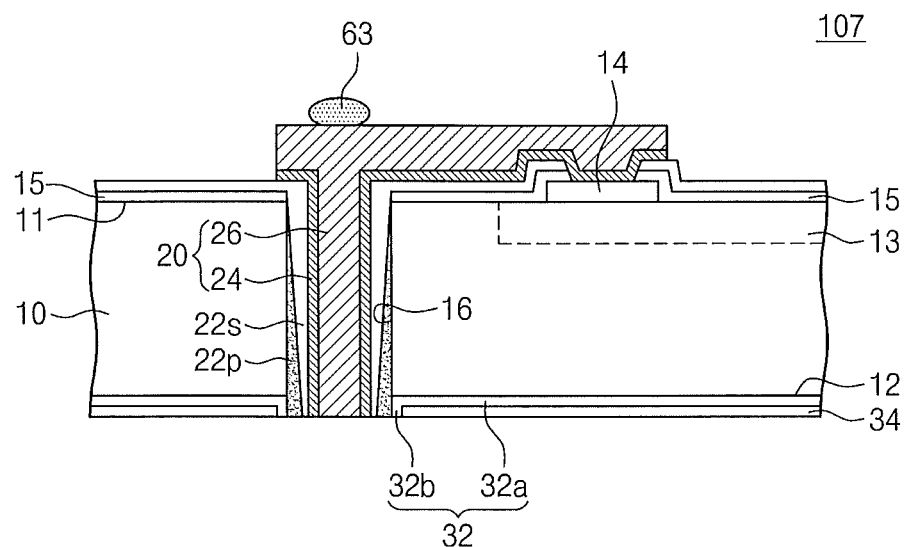
FIG. 7 is a cross-sectional view illustrating a semiconductor device according to still another embodiment of the inventive concept.

A difference between a semiconductor device 107 according to still another embodiment of the inventive concept illustrated in FIG. 7 and the above-described semiconductor device 101 may include the via hole insulation layer having a different structure, which may include a first insulation layer 22p and a second insulation layer 22s, where the first insulation layer 22p may include a polymer. The first insulation layer 22p may have a larger thickness at a lower part of the via hole 16 than at an upper part of the via hole 16. The second insulation layer 22s may have a smaller thickness at a lower part of the via hole 16 than at an upper part of the via hole 16 and may extend from the sidewall of the via hole 16 onto the passivation layer 15, and may expose part of the pad 14.

Figure 8:
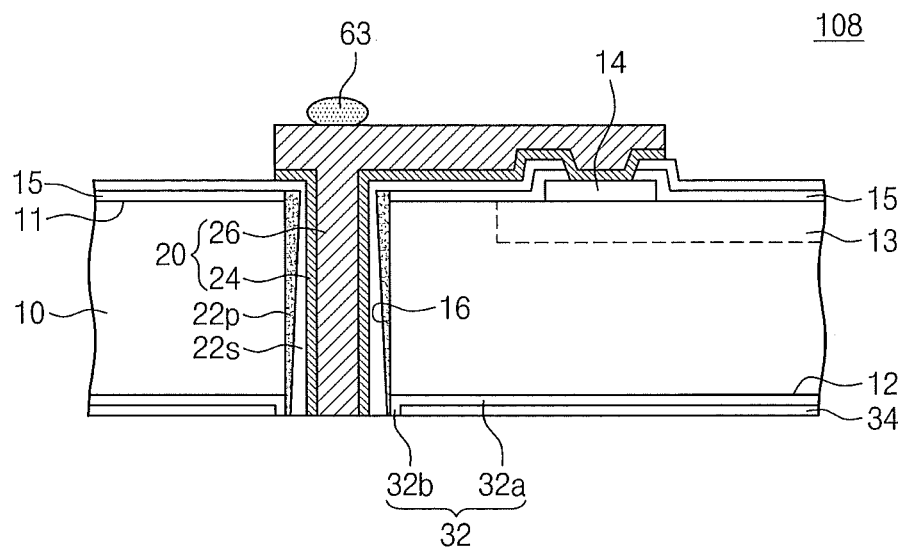
FIG. 8 is a cross-sectional view illustrating a semiconductor device according to still another embodiment of the inventive concept.

A difference between a semiconductor device 108 according to still another embodiment of the inventive concept illustrated in FIG. 8 and the above-described semiconductor device 101 may include the via hole insulation layer having a different structure, which may include a first insulation layer 22p and a second insulation layer 22s on the first insulation layer 22p. The first insulation layer 22p may have a smaller thickness at a lower part of the via hole 16 than at an upper part of the via hole 16. The second insulation layer 22s may have a larger thickness at a lower part of the via hole 16 than at an upper part of the via hole 16. In other embodiments, the first or second insulation layers 22p or 22s may not cover the whole sidewall of the via hole 16.

Figure 9:
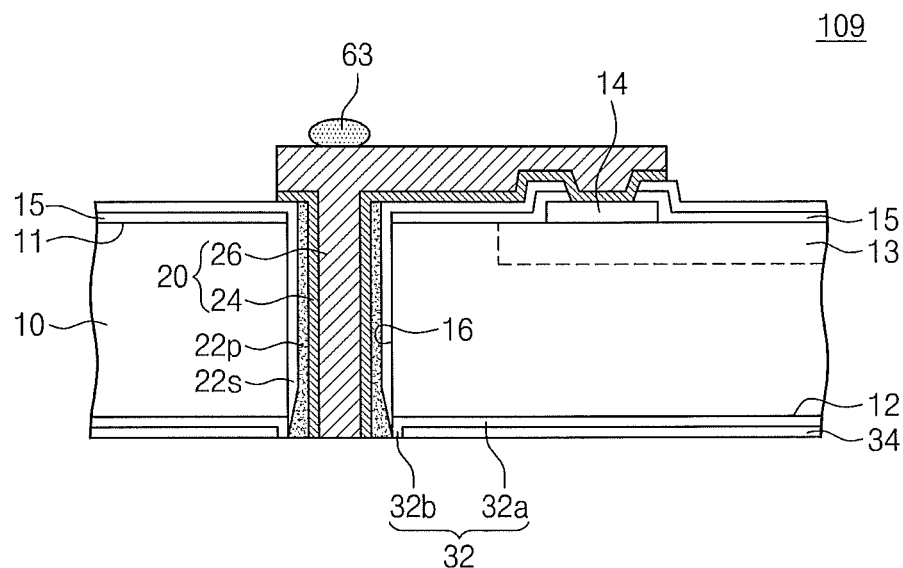
FIG. 9 is a cross-sectional view illustrating a semiconductor device according to still another embodiment of the inventive concept.

A difference between a semiconductor device 109 according to still another embodiment of the inventive concept illustrated in FIG. 9 and the above-described semiconductor device 101 may include the via hole insulation layer having a different structure, which may include a first insulation layer 22s and a second insulation layer 22p on the first insulation layer 22s.

The first insulation layer 22s may have a decreasing thickness at a lower part of the via hole 16 as a distance away from the second surface 12 of the substrate 10 increases, and may have a uniform thickness at an upper part of the via hole 16. The second insulation layer 22p may have an increasing thickness at a lower part of the via hole 16 as the a distance away from the second surface 12 of the substrate 10 increases and may have a uniform thickness at an upper part of the via hole 16.

Figure 10:
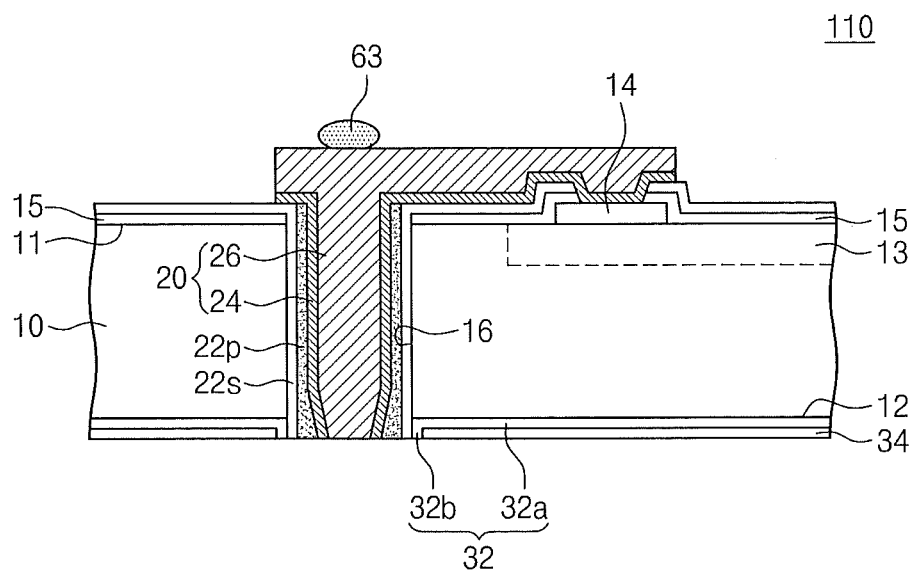
FIG. 10 is a cross-sectional view illustrating a semiconductor device according to still another embodiment of the inventive concept.

A difference between a semiconductor device 110 according to still another embodiment of the inventive concept illustrated in FIG. 10 and the above-described semiconductor device 101 may include the via hole insulation layer having a different structure, where the first insulation layer 22s may have a uniform thickness at the sidewall of the via hole 16. The second insulation layer 22p may have an increasing thickness at a lower part of the via hole 16 as a distance from the second surface 12 of the substrate 10 increases and may have a uniform thickness at an upper part of the via hole 16.

According to the above-described embodiments of the inventive concept, since the structure of the TSV has the multi-layered insulation layer, electric characteristics and reliability of the TSV structure may be improved.

An exemplary method of fabricating the semiconductor device according to the embodiment of the inventive concept described referring to FIG. 1 will be described. FIGS. 11 to 18 are cross-sectional views for explaining the exemplary method of fabricating the semiconductor device.

Figure 11:
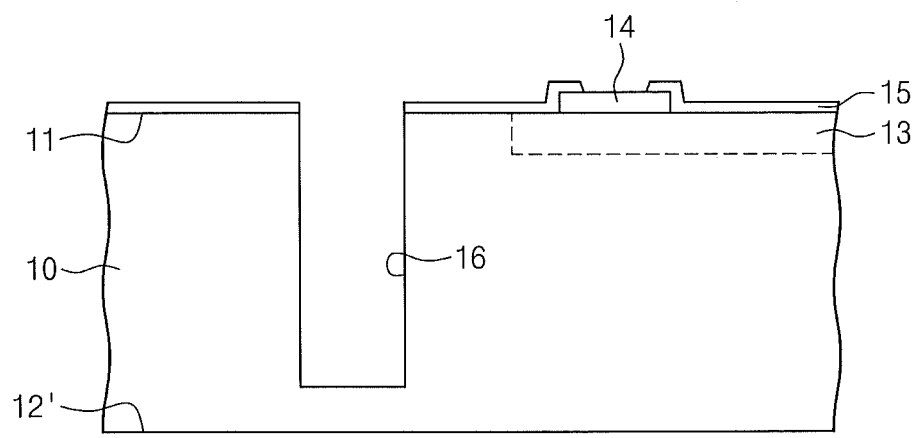
FIGS. 11 to 21 are cross-sectional views illustrating a method of fabricating the semiconductor device according to the embodiment of the inventive concept.

Referring to FIG. 11, the integrated circuit 13 is formed at the inside of the substrate 10 or at the first surface 11. The pad 14 may be electrically connected to the integrated circuit 13 and formed on the integrated circuit 13. If the pad 14 is formed of Al, the pad 14 may be formed on the integrated circuit 13 as illustrated in FIG. 11. If the pad 14 is formed of, Cu, the pad 14 may be formed to be included as part of the integrated circuit 13 as a damascene structure.

A passivation layer 15 exposing a part of pad 14 may be formed on the first surface 11 of the substrate 10, and may protect the integrated circuit 13 from the external environment and may be formed of silicon oxide, silicon nitride, or their combination.

A via hole 16 may be recessed to a certain depth below the first surface 11 of the substrate 10. The via hole 16 may be formed in a region of the peripheral circuit (not illustrated) or the scribe lane. Otherwise, the via hole 16 may be formed to penetrate or overlap the pad 14. The via hole 16 may be formed using dry etching, wet etching, laser drilling, or mechanical drilling. The depth of the via hole 16 may be larger than a thickness of the integrated circuit 13 and smaller than a thickness of the substrate 10 so that the via hole 16 may be separated from an initial second surface 12'.

Figure 12:
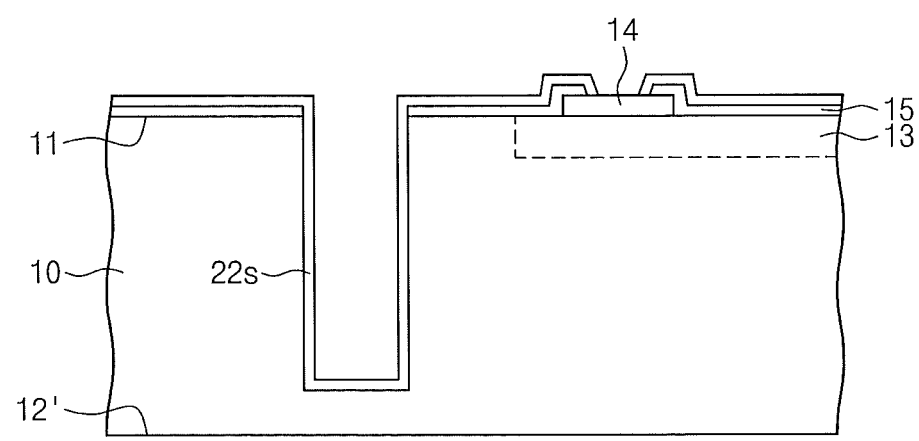

Referring to FIG. 12, a first insulation layer 22s is formed on an inner surface of the via hole 16. The first insulation layer 22s may extend from the inner surface of the via hole 16 onto the first surface 11 of the substrate 10. Using a photolithography process, a part of the first insulation layer 22s on the pad 14 is removed so that part of the pad 14 is exposed.

Figure 13:
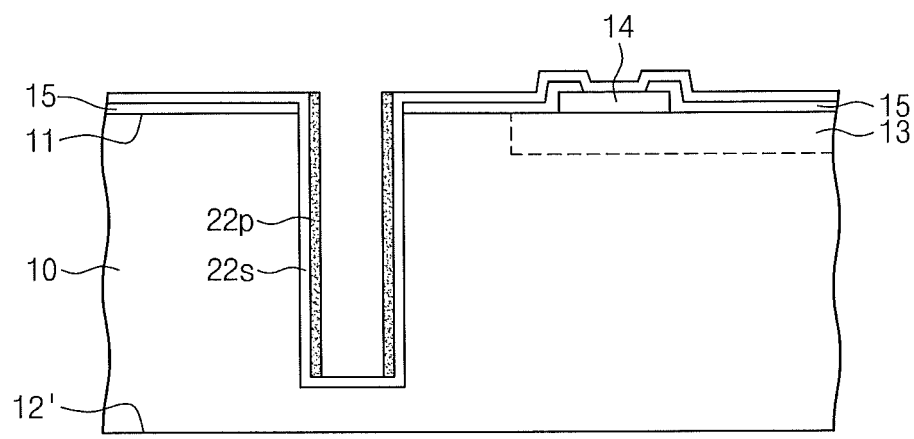

Referring to FIG. 13, a second insulation layer 22p is formed on the sidewall of the via hole 16. Due to $CF_x$ components generated during the plasma process using the CF-based gas, a CF-based polymer $(CF_2)_n$ is generated so that the second insulation layer 22p may be formed substantially only on the portion of the first insulation layer 22s disposed on the sidewall of the via hole 16. The second insulation layer 22p may be formed to have various forms referred to as the reference numerals 22p and 22pa of FIGS. 1 to 10.

Otherwise, the forming of second insulation layer 22p may include etching the portion of the first insulation layer 22s on a bottom surface of the via hole 16. The CF-based gas may include at least one gas selected from $C_4F_6$, $C_4F_8$, $C_5F_8$, $CHF_3$, $SF_6$ or/and $O_2$. Although not illustrated, the first insulation layer 22s on the bottom surface of the via hole 16 may be removed by the plasma process. The second insulation layer 22p may be formed to have various forms referred to as the reference numerals 22p and 22pa of FIGS. 1 to 10.

Although not illustrated, at least one additional insulation layer may be further formed on the sidewall of the via hole 16 where the second insulation layer 22p is formed. That is, a third insulation layer and a fourth insulation layer may be sequentially formed on the second insulation layer and may include similar materials as the first and second insulation layers.

Figure 14:
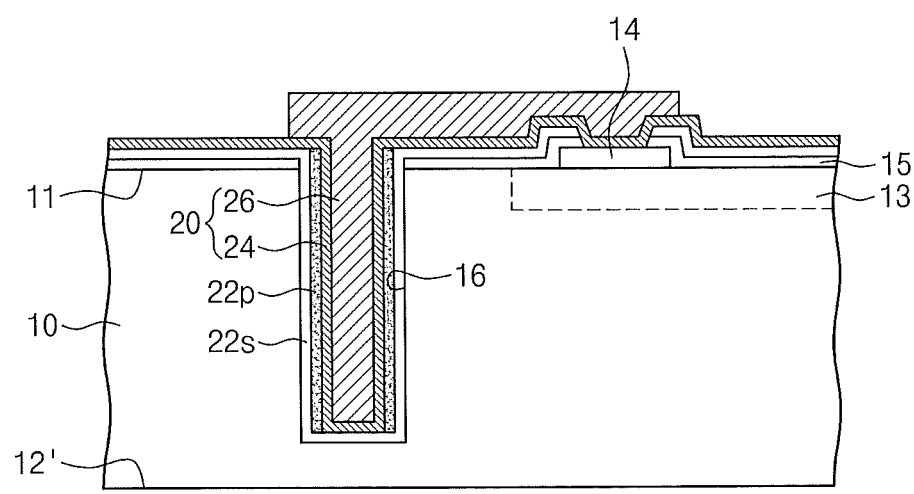

Referring to FIG. 14, a barrier layer 24 may be formed on the top insulation layer. The barrier layer 24 may include Ti, TiN, Ta, and TaN, and may serve to prevent metal of a wiring pattern for the TSV from diffusing into the substrate 10.

By filling the inside of the via hole 16 with the TSV wiring pattern and patterning it, the via conductor 26 is formed. The via conductor 26 may be formed in the inside of the via hole 16 by using an electroplating process, an electroless plating process, or a selective deposition process. The electroplating process may include forming a seed layer in the inside of the via hole 16 where the barrier layer 24 is formed and plating the wiring pattern using the seed layer. The seed layer may be formed in a vapor phase deposition, such as sputtering. The via conductor 26 may include Ag, Au, Cu, W, and In. The via conductor 26 may extend onto the first surface 11 of the substrate 10 to be electrically connected to the pad 14, or may be formed to penetrate or to overlap the pad 14.

According to the embodiment of the inventive concept, since the structure of the TSV has a multi-layered insulation layer including at least the first and second insulation layers 22s and 22p, electrical characteristics and reliability of the TSV structure may be improved.

Figure 15:
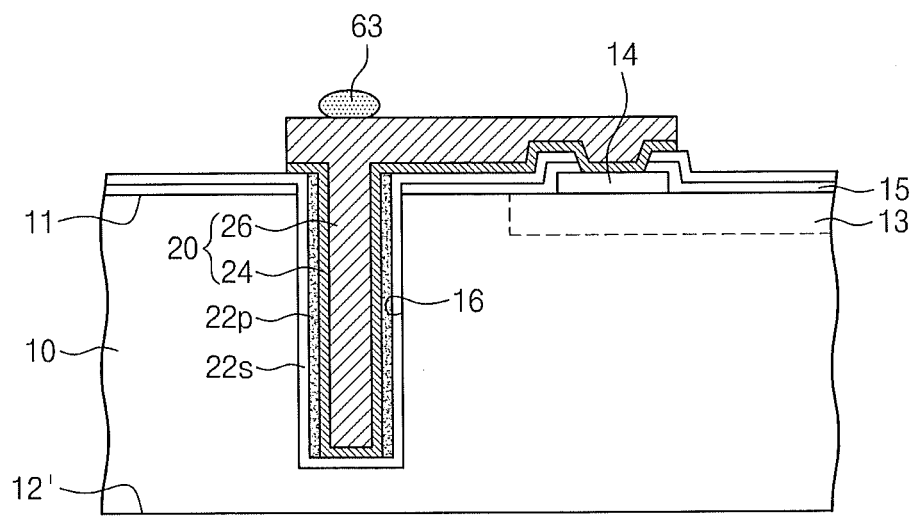

Referring to FIG. 15, a part of the barrier layer 24 may be removed using the via conductor 26 as a mask. Removing the barrier layer 24 may be performed using dry etching or wet etching. Thereafter, a connector 63 may be formed on the via conductor 26. The connector 63 may be a solder ball.

Figure 16:
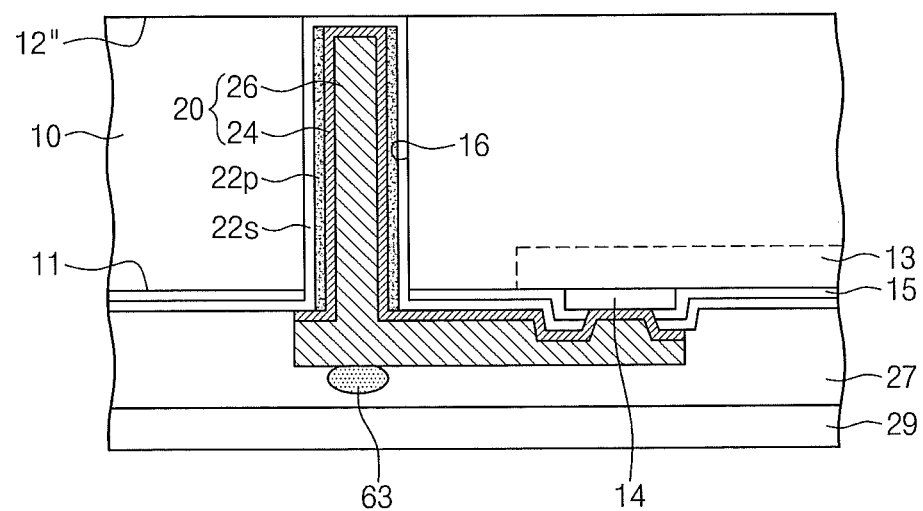

Referring to FIG. 16, a process of polishing the initial second surface 12' of the substrate 10 is performed. First, a carrier substrate 29 may adhere onto the first surface 11 of the substrate 10 by using an adhesive layer 27. The carrier substrate 29 may relieve mechanical stress caused by the process of polishing the initial second surface 12' of the substrate 10 and may prevent the substrate 10 which is thinned after the polishing process from being bent. The carrier substrate 29 may include a glass substrate or a resin substrate, and the adhesive layer 27 may include ultraviolet adhesive or thermoplastic adhesive. Next, the initial second surface 12' of the substrate 10 is polished so that at least one of the first and second insulation layers 22s and 22p are exposed. The process of polishing the initial second surface 12' of the substrate 10 may be performed, e.g., by using a grinding method. The polished second surface 12" may be higher than or lower than the first and second insulation layers 22s and 22p.

Figure 17:
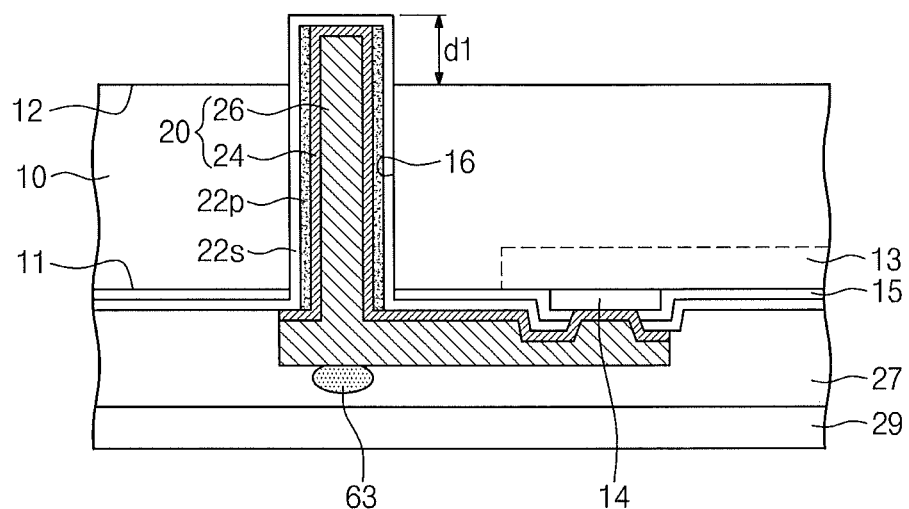

Referring to FIG. 17, the polished second surface 12" is selectively etched so that the via conductor 26 surrounded by the first and second insulation layers 22s and 22p protrudes from the second surface 12 of the substrate 10. The selective etching for the substrate 10 may be performed using wet or dry etching having a higher substrate 10 etch rate compared with the first and second insulation layers 22s and 22p. For instance, in the case that the first insulation layer 22s is silicon oxide, the substrate 10 may be selectively etched by using $SF_6$ etch gas. An etched thickness d1 of the substrate 10 may be equal to or larger than a sum of thicknesses of the first and second sub insulation layers (32 and 34 in FIG. 18) which are formed later and the first and second insulation layers 22s and 22p. In the case where barrier layer 24 is formed, the etched thickness d1 may be equal to or larger than a sum of thicknesses of the later formed first and second sub insulation layers (32 and 34 in FIG. 18), the first and second insulation layers 22s and 22p, and the barrier layer 24.

Figure 18:
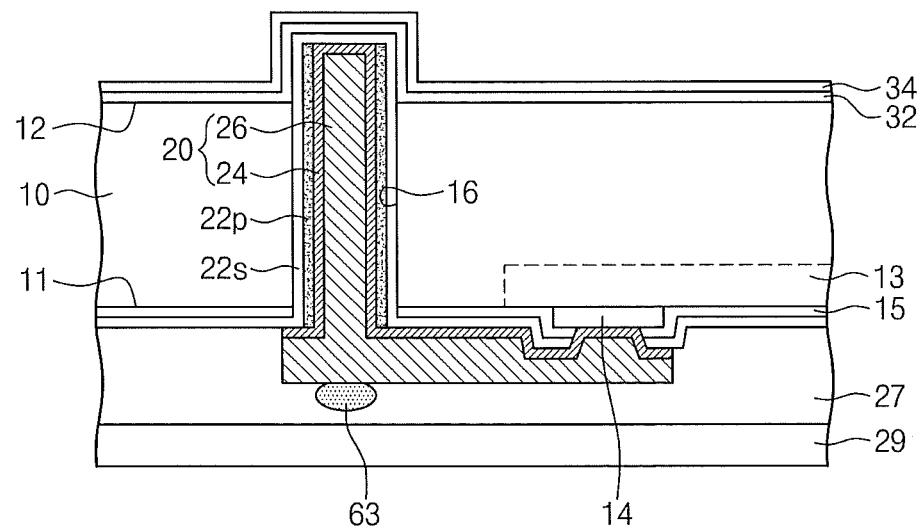

Referring to FIG. 18, the first and second sub insulation layers 32 and 34 are sequentially formed on the second surface 12 of the substrate 10 and the protruded first and second insulation layers 22s and 22p. The first sub insulation layer 32 may be formed of silicon oxide, and the second sub insulation layer 34 may be formed of silicon nitride. Since the carrier substrate 29 is adhered onto the first surface 11 of the substrate 10 by the adhesive layer 27, the first and second sub insulation layers 32 and 34 may be formed by using Chemical Vapor Deposition (CVD) at a low temperature about 300° C. considering thermal stability of the adhesive layer 27.

Referring to FIG. 1 again, the planarization process is performed using the second sub insulation layer 34 as the planarization stop layer. The planarization process may be performed by using Chemical Mechanical Polishing (CMP). By the planarization process, parts of the second sub insulation layer 34, the first sub insulation layer 32, the first and second insulation layers 22s and 22p, the barrier layer 24, and the via conductor 26 which protrude from the second sub insulation layer 34 on the second surface 12 of the substrate 10 are removed. After the planarization process, the carrier substrate 29 and the adhesive layer 27 may be removed. In the case of the barrier layer 24, the planarization process may be performed so that the barrier layer 24 is not removed and still remains on an upper part of the via conductor 26.

Meanwhile, although not illustrated, the remaining second sub insulation layer 34 may be eliminated. The second sub insulation layer 34 may be removed by using wet or dry etching having a high etch selectivity in comparison with the first sub insulation layer 32. Particularly, in the case that the second sub insulation layer 34 is formed of silicon nitride layer (SiN), for reducing stress applied to the substrate 10, the second sub insulation layer 34 may be removed.

In the embodiment of the inventive concept, by exposing the via conductor 26 through the planarization process using the second sub insulation layer 34 as the planarization stop layer, the photolithography process for removing the insulation layers on the via conductor 26 may be omitted. When the via conductor 26 is exposed by using a photolithography process, if the via conductor 26 has a narrow width, the elimination of the first and second insulation layers 32 and 34 may be not easy due to the resolution limit of the photolithography process. However, according to the embodiment of the inventive concept, the via conductor 26 may be easily exposed regardless of the width of the via conductor 26.

According to the embodiment of the inventive concept, even if the via conductor 26 is exposed during the planarization process, the substrate 10 may not be contaminated by metal material because the second surface 12 of the substrate 10 is covered with the first and second sub insulation layers 32 and 34.

Figure 19:
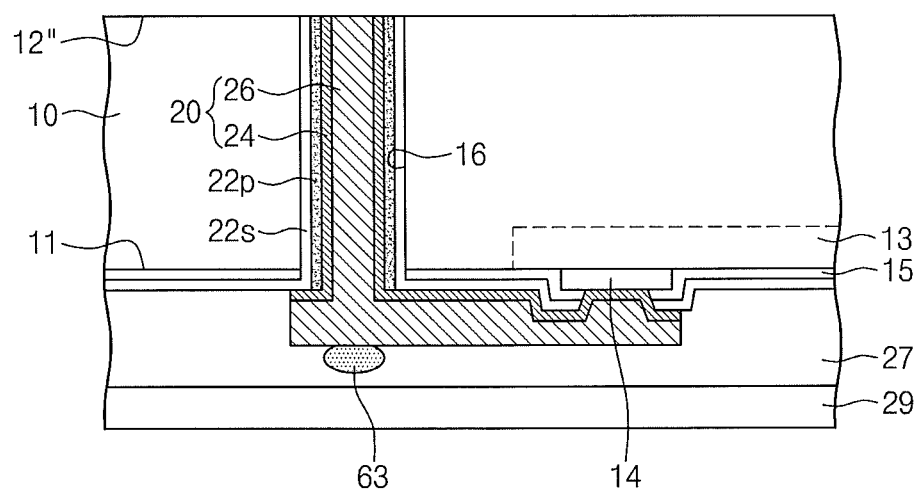
Figure 20:
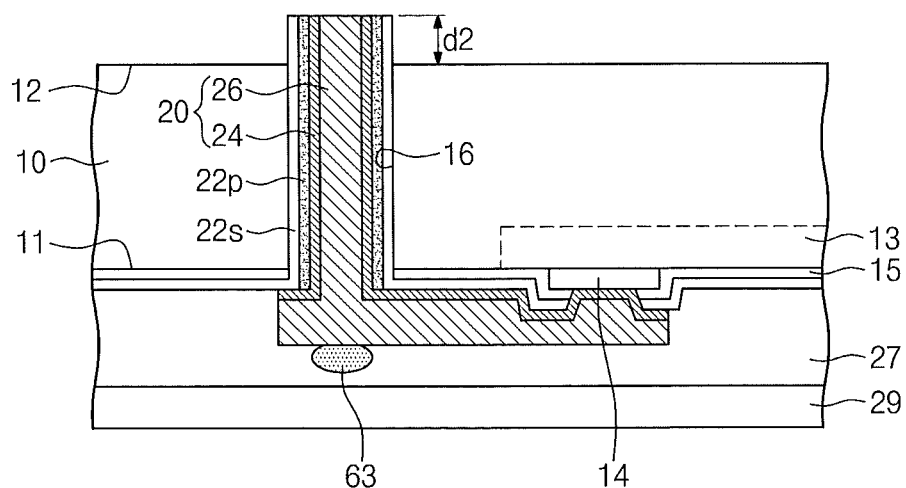
Figure 21:
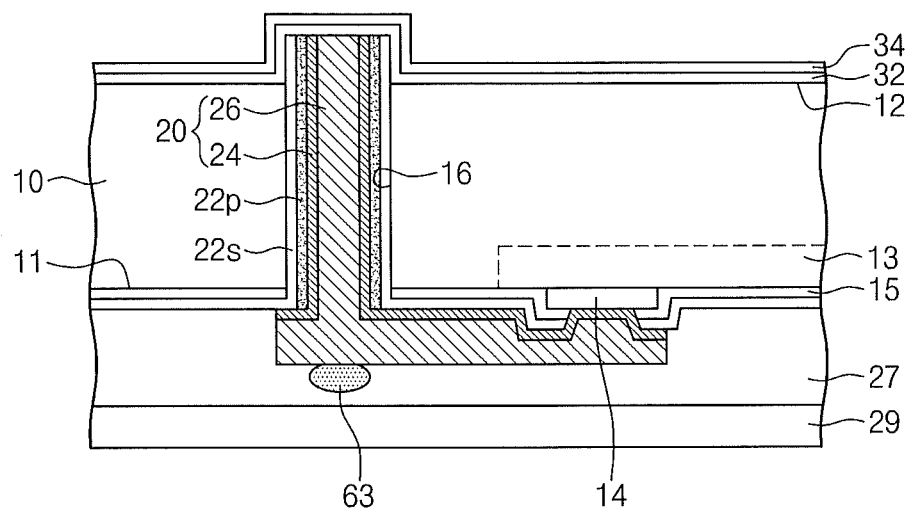

FIGS. 19 to 21 are cross-sectional views for explaining another exemplary method of fabricating the semiconductor device according to an embodiment of the inventive concept. For the structural elements already explained through the above-described exemplary method, the same reference numerals are used and descriptions for them are omitted.

Referring to FIG. 19, following the polishing process described referring to FIG. 16, parts of the substrate 10, the first and second insulation layers 22s and 22p, the barrier layer 24, and the via conductor 26 are removed by using a first planarization process so that the via conductor 26 is exposed. The first planarization process may be performed by using CMP. The polished second surface 12" may be higher than or lower than the exposed surface of the via conductor 26.

Referring to FIG. 20, the polished second surface 12" of the substrate 10 is selectively etched so that the polished via conductor 26 is protruded from the second surface 12 of the substrate 10. For instance, the substrate 10 may be selectively etched by using HBr etch gas. An etched thickness d2 of the substrate 10 may be equal to or larger than a sum of thicknesses of the first and second sub insulation layers (32 and 34 of FIG. 18).

Referring to FIG. 21, the first and second sub insulation layers 32 and 34 are sequentially formed on the protruded via conductor 26 and the second surface 12 of the substrate 10.

The first and second sub insulation layers 32 and 34 are also formed on the first and second insulation layers 22s and 22p and the barrier layer 24. The first sub insulation layer 32 may be formed of silicon oxide, and the second sub insulation layer 34 may be formed of silicon nitride.

Referring to FIG. 1 again, a second planarization process is performed using the second sub insulation layer 34 as the planarization stop layer. By the second planarization process, the via conductor 26 may be exposed remaining the first and second sub insulation layers 32 and 34 on the second surface 12 of the substrate 10. Accordingly, the TSV 20 of the semiconductor device may be connected to that of another semiconductor device. After the second planarization process, the carrier substrate 29 and the adhesive layer 27 may be removed. Meanwhile, the remaining second sub insulation layer 34 may be removed.

An exemplary method of fabricating the semiconductor device according to the other embodiment of the inventive concept described referring to FIG. 2 will be described. FIGS. 22 to 29 are cross-sectional views for explaining the exemplary method of fabricating the semiconductor device according to another embodiment of the inventive concept. For the structural elements already explained above the same reference numerals are used and descriptions for them are omitted.

Figure 22:
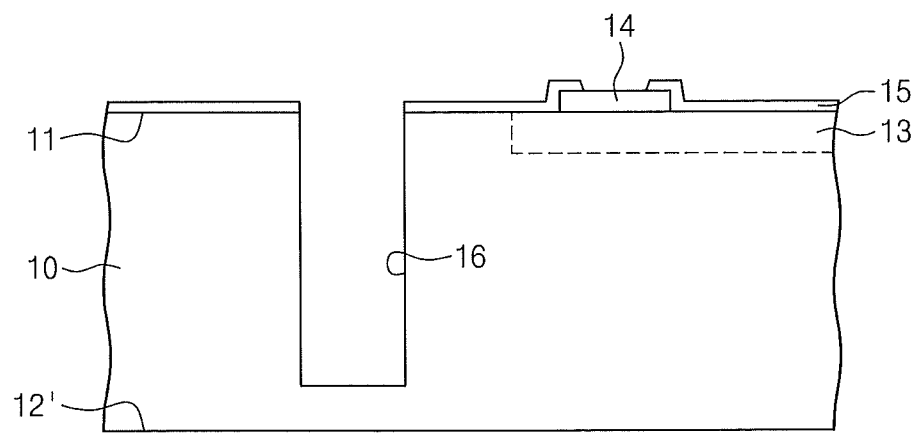
FIGS. 22 to 32 are cross-sectional views illustrating a method of fabricating the semiconductor device according to another embodiment of the inventive concept.

Referring to FIG. 22, the via hole 16 is formed in the manner described referring to FIG. 11.

Figure 23:
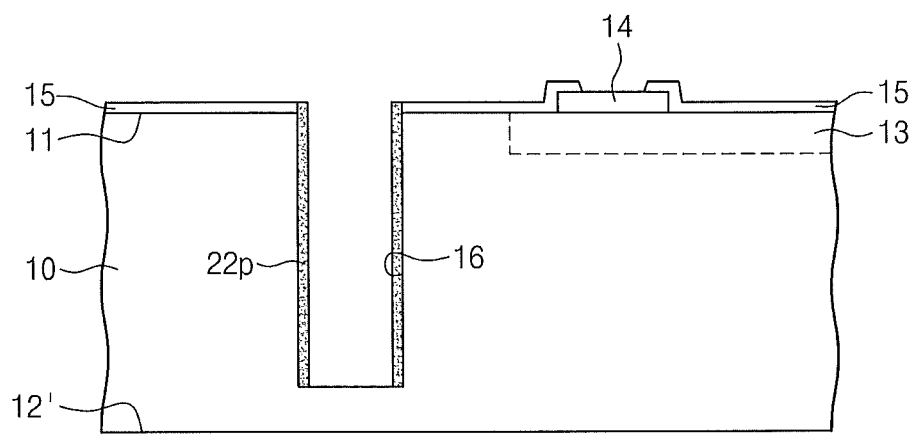

Referring to FIG. 23, the first insulation layer 22p is formed on the sidewall of the via hole 16. The first insulation layer 22p may include the polymer. Preferably, the first insulation layer 22p may be the CF-based polymer layer. The first insulation layer 22p may be formed through the plasma process using at least one selected from $C_4F_6$, $C_4F_8$, $C_5F_8$, and $CHF_3$.

The forming the first insulation layer 22p may expose the bottom of via hole 16. The first insulation layer 22p may be formed to have various forms referred to as the reference numerals 22p and 22pa of FIGS. 1 to 10.

Otherwise, the via hole 16 may expose an interlayer dielectric (not illustrated) of the substrate 10. The forming the first insulation layer 22p may etch the silicon oxide layer used as the interlayer dielectric exposed on a bottom surface of the via hole 16 using at least one selected from $C_4F_6$, $C_4F_8$, $C_5F_8$, $CHF_3$, $SF_6$ and $O_2$.

Figure 24:
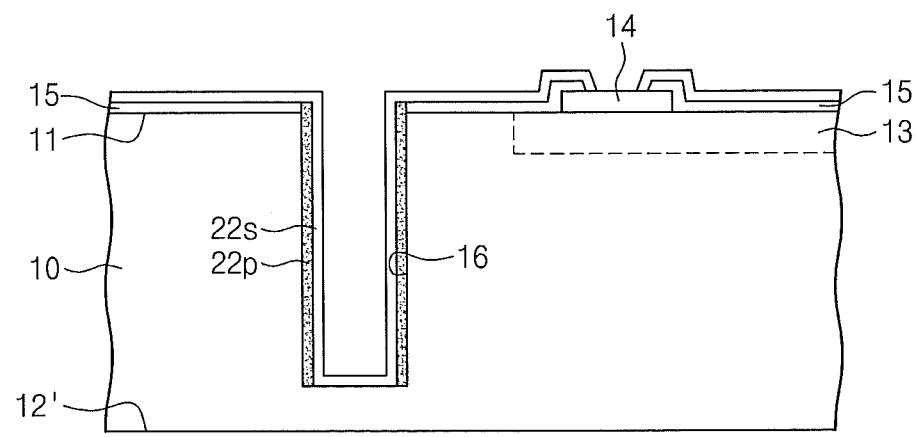
Figure 25:
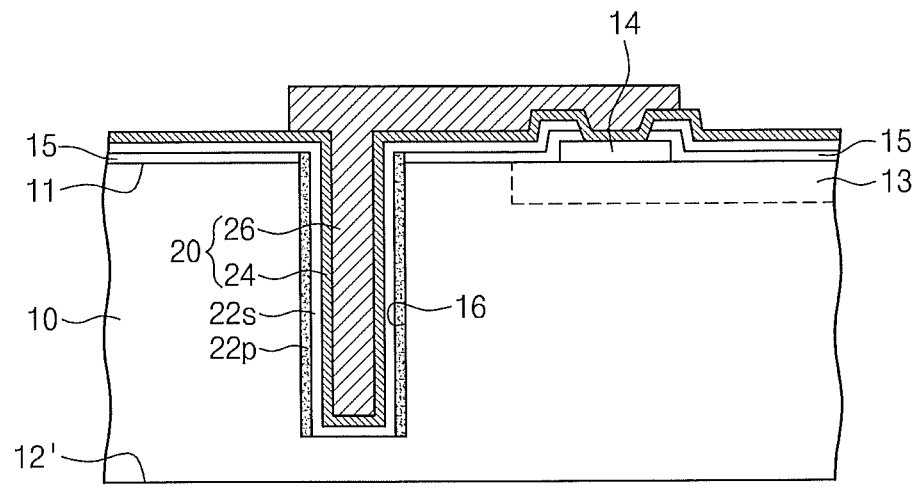
Figure 26:
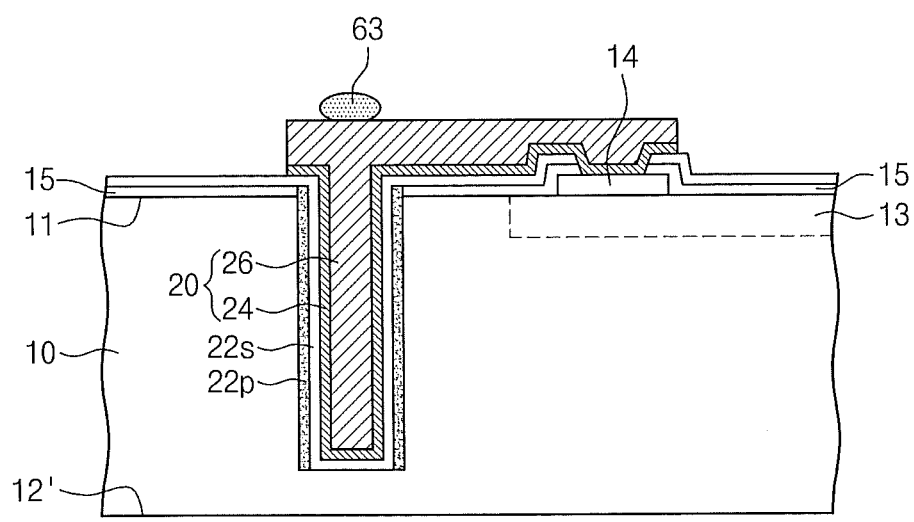
Figure 27:
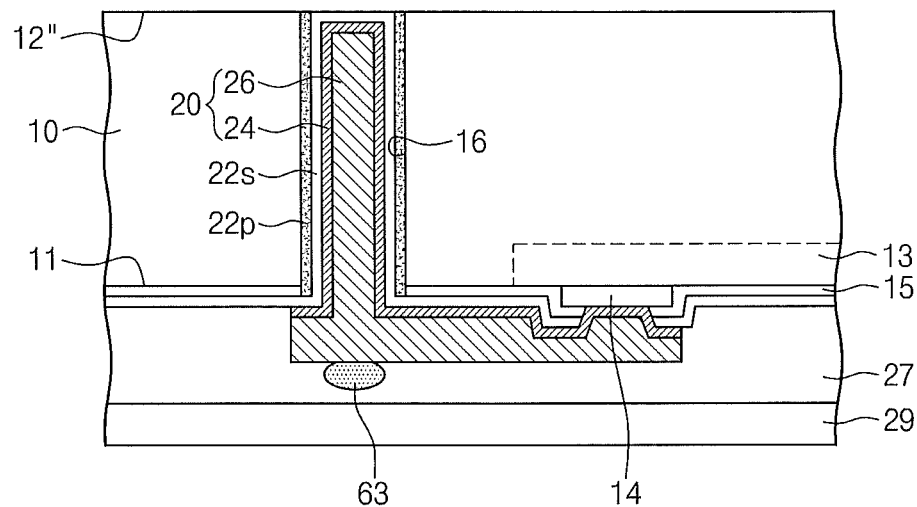
Figure 28:
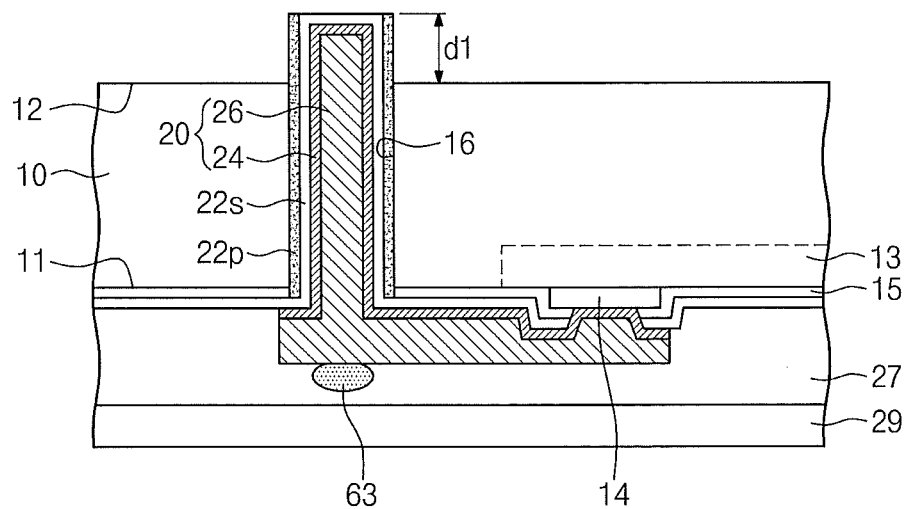
Figure 29:
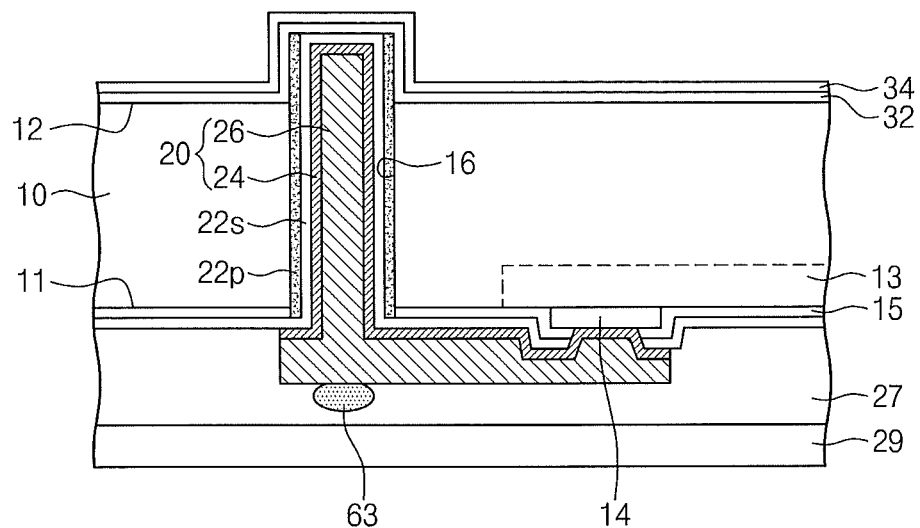

Referring to FIG. 24, the second insulation layer 22s is formed on the inner surface of the via hole 16 where the first insulation layer 22p is formed. The second insulation layer 22s may extend from the inner surface of the via hole 16 onto the first surface 11 of the substrate 10. By using a photolithography process, a part of the second insulation layer 22s on the pad 14 is removed so that the part of the pad 14 is exposed.

Referring to FIGS. 25 to 29, the via conductor 26 and the first and second sub insulation layers 32 and 34 are formed in the manner described referring to FIGS. 14 to 18. By performing the planarization process using the second sub insulation layer 34 as the planarization stop layer, the structure illustrated in FIG. 2 may be formed.

Figure 30:
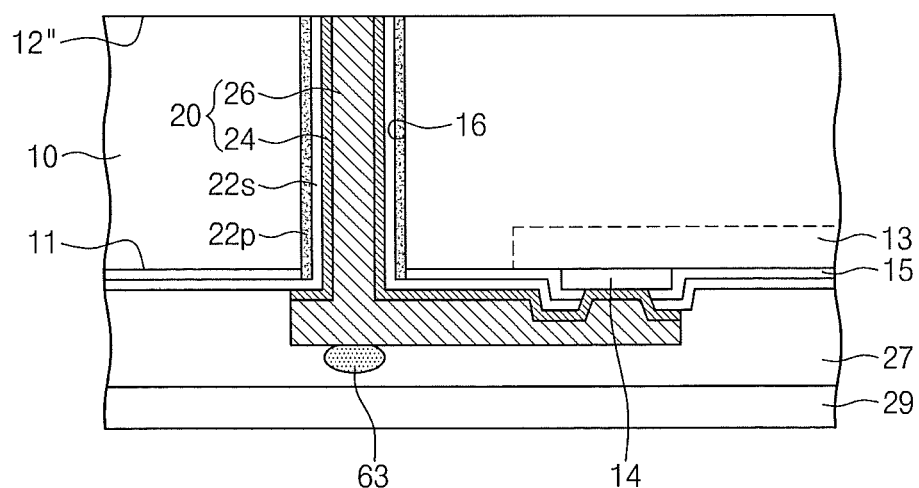
Figure 31:
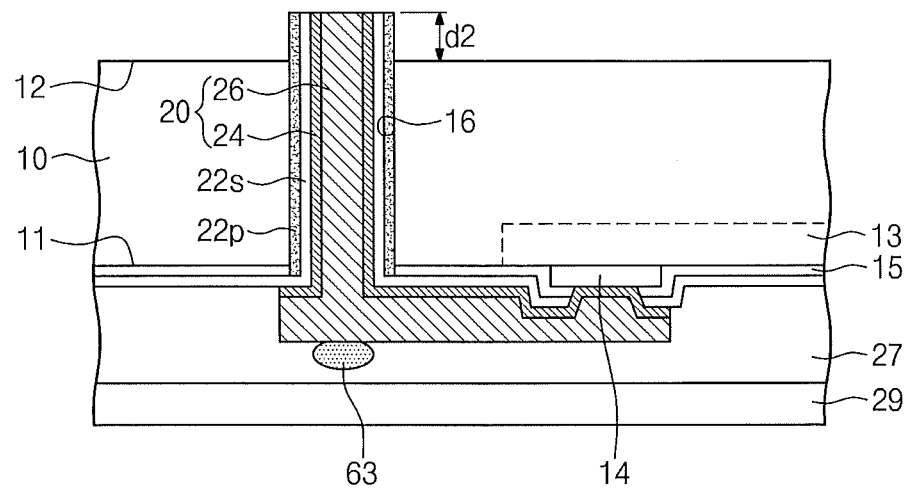
Figure 32:
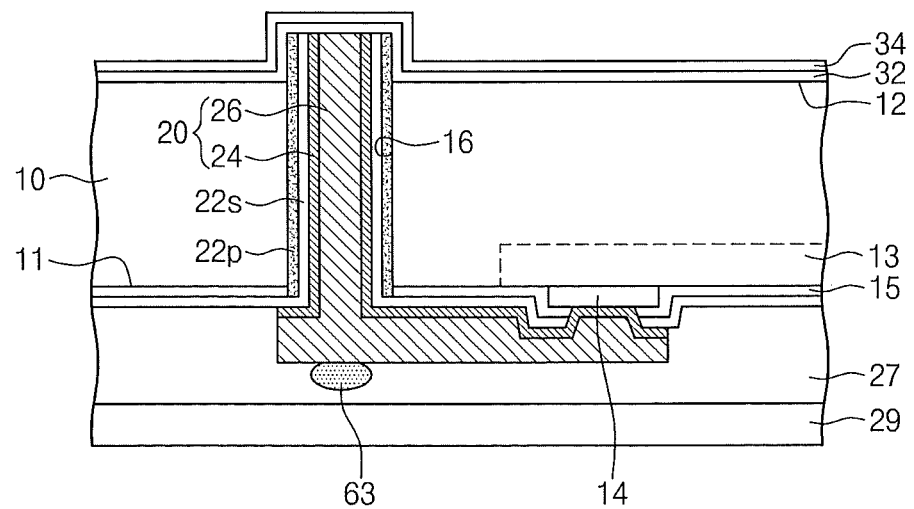

Another exemplary method of fabricating the semiconductor device according to the other embodiment of the inventive concept described referring to FIG. 2 will be described. FIGS. 30 to 32 are cross-sectional views explaining the exemplary method of fabricating the semiconductor device. Structural elements already explained above use the same reference numerals and descriptions for them are omitted.

Referring to FIGS. 30 to 32, the first and second sub insulation layers 32 and 34 are formed in the manner described referring to FIGS. 19 to 21. By performing the planarization process using the second sub insulation layer 34 as the planarization stop layer, the structure illustrated in FIG. 2 may be formed.

Figure 33:
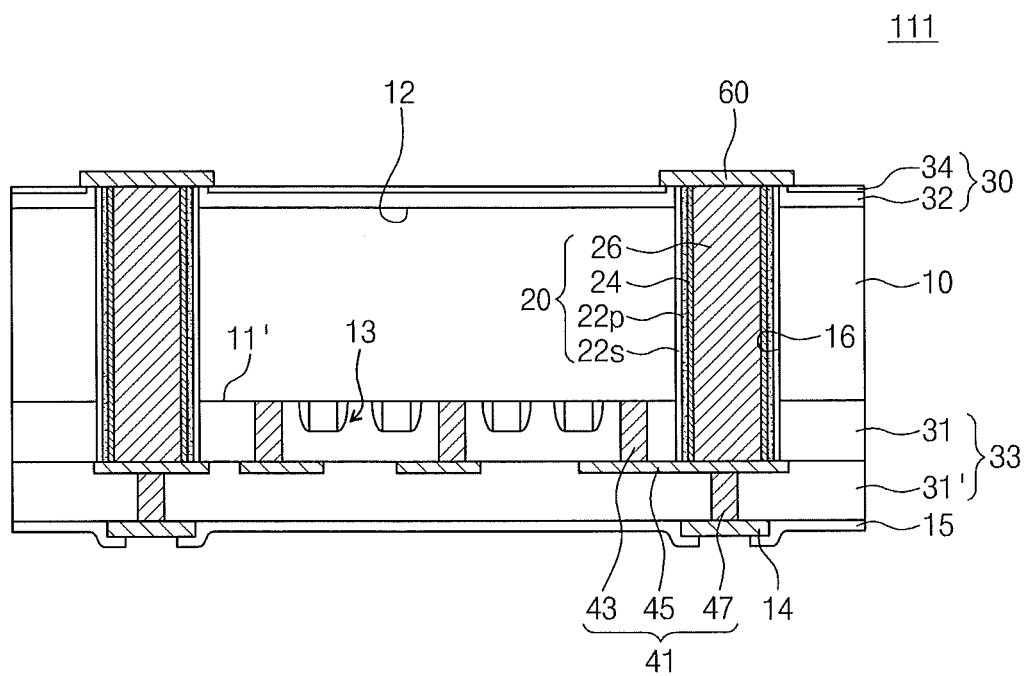
FIG. 33 is a cross-sectional view illustrating a semiconductor device according to still another embodiment of the inventive concept.

FIG. 33 is a cross-sectional view illustrating a semiconductor device 111 according to still another embodiment of the inventive concept.

Referring to FIG. 33, a semiconductor substrate 10 is provided. For instance, the semiconductor substrate 10 may be a silicon substrate. The semiconductor substrate 10 may include a first surface 11' and a second surface 12 opposing the first surface 11'. The semiconductor device 111 may include an integrated circuit 13 on the semiconductor substrate 10. A type of the integrated circuit 13 may be different according to the type of semiconductor device 111. For instance, the integrated circuit 13 may include at least one of a memory circuit, a logic circuit, and their combination. The integrated circuit 13 may include a passive device including a resistor or a capacitor.

The via hole 16 penetrates the semiconductor substrate 10 being separated from the integrated circuit 13. The via hole 16 may have the same diameter from the first surface 11' to the second surface 12 of the semiconductor substrate 10, may have different two or more diameters, or may have a tapered form where the diameter is gradually changed.

A TSV 20 may be provided to fill at least a part of the via hole 16. The TSV 20 may be connected to the integrated circuit 13 of the semiconductor device 111, may connect the semiconductor device 111 to another semiconductor device, or may connect the semiconductor device 111 to a package substrate or a module substrate. The TSV 20 may include a barrier layer 24 on an inner wall of the via hole 16 and a via conductor 26 on the barrier layer 24. The conducive connection unit 26 may fill at least a part of the via hole 16, and may have a part protruded from the second surface 12 of the semiconductor substrate 10. A via hole insulation layer may be provided between the semiconductor substrate 10 exposed by the via hole 16 and the barrier layer 24. The via hole insulation layer may be the structure described referring to FIGS. 1 to 10. The barrier layer 24 includes material capable of preventing conductive material included in the via conductor 26 from being diffused to the semiconductor substrate 10. For instance, the barrier layer 24 may include Ti, TiN, Ta, or TaN, and may be formed by using sputtering. The via conductor 26 may include Cu, W, Al, Ag, Au, In, or polysilicon.

A surface insulation layer 30 may be provided on the second surface 12 of the semiconductor substrate 10, and may extend from the second surface 12 of the semiconductor substrate 10 to a sidewall of the via hole 16. The surface insulation layer 30 may include silicon oxide, silicon nitride, or silicon oxinitride. For instance, the surface insulation layer 30 may include a first sub insulation layer 32 on the second surface 12 of the semiconductor substrate 10 and a second sub insulation layer 34 on the first sub insulation layer 32. The first sub insulation layer 32 may be a silicon oxide layer, and the second sub insulation layer 34 may be a silicon nitride layer.

A connection pad 60 covering the via conductor 26 and at least a part of the surface insulation layer 30 may be provided on the second surface 12 of the semiconductor substrate 10. The connection pad 60 may be directly connected to the protruding part of the via conductor 26.

An interlayer dielectric 33 covering the first surface 11' of the semiconductor substrate 10 and the integrated circuit 13, and an internal wiring 41 connecting the integrated circuit 13 and the pad 14 may be provided. The interlayer dielectric 33 may include a plurality of insulation layers. For instance, the interlayer dielectric 33 may include a first interlayer dielectric 31 covering the first surface 11' of the semiconductor substrate 10 and a second interlayer dielectric 31' on the first interlayer dielectric 31 covering the integrated circuit 13. A passivation layer 15 may be provided on the interlayer dielectric 33 exposing a part of the pad 14. The internal wiring 41 may include first and second contact plugs 43 and 47 penetrating at least a part of the interlayer dielectric 33, and a second wiring pattern 45 on or inside the interlayer dielectric 33. For instance, the second wiring pattern 45 may be a first metal layer. The first and second contact plugs 43 and 47 and the second wiring pattern 45 may be formed by using the patterning or damascene method.

The semiconductor device 111 may be a semiconductor device of a via middle structure where the TSV 20 is formed after the integration circuit 13 is formed. For instance, after forming the integrated circuit 13, the first interlay dielectric 31, and the first contact plug 43 on the first surface 11' of the semiconductor substrate 10, the TSV 20 penetrating the semiconductor substrate 10 and the first interlayer dielectric 31 is formed. Next, the second wiring pattern 45 connecting the first contact plug 43 and the via conductor 26, the second contact plug 47, and the pad 14 are formed.

Figure 34:
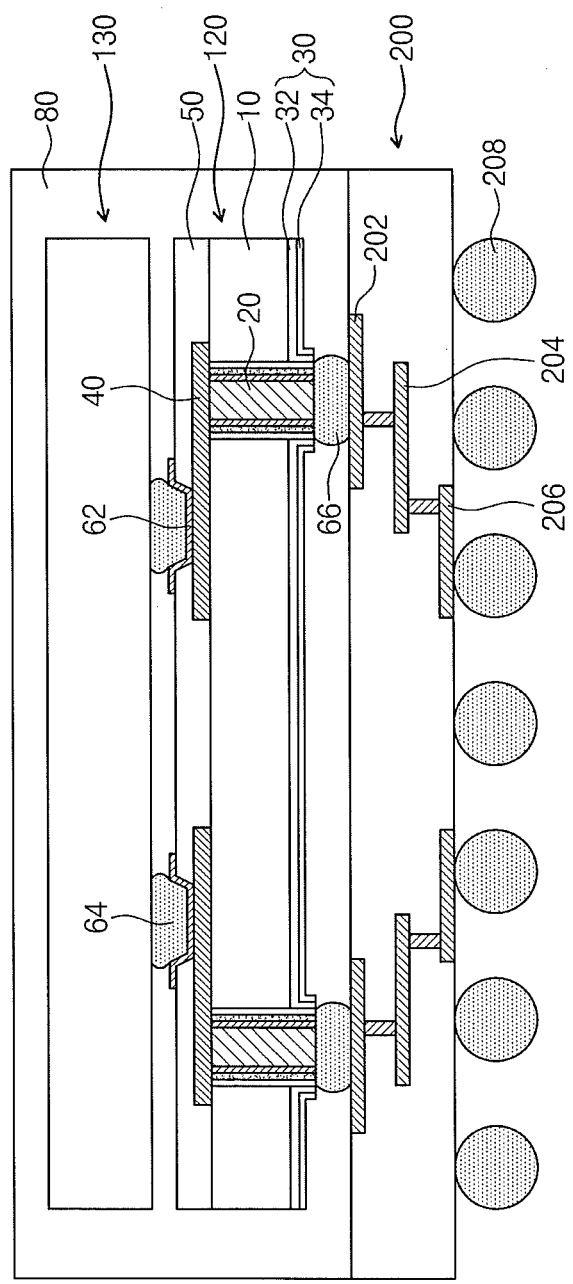
FIG. 34 is a cross-sectional view illustrating an interposer according to the embodiments of the inventive concept and its exemplary application.

The TSVs 20 described referring to FIGS. 1 to 10 may be applied to an interposer (120 of FIG. 34). In this case, the integrated circuit 13 described referring to FIG. 33 may not be formed.

FIG. 34 is a cross-sectional view illustrating an interposer according to the embodiments of the inventive concept and its exemplary application.

Referring to FIG. 34, a semiconductor substrate 10 may be a silicon or glass substrate. A second connection terminal 66 may be formed on a surface of the semiconductor substrate 10. The second connection terminal 66 may be selected from a conductive bump, a solder ball, a conductive spacer, and a Pin Grid Array (PGA).

A first wiring layer 40 electrically connected to the TSV 20 and a second insulation layer 50 covering the first wiring layer 40 may be formed on a first surface 11 of the semiconductor substrate 10. The first wiring layer 40 may be a rewiring for another semiconductor device stacked on an interposer 120. The second insulation layer 50 may expose a part of the first wiring layer 40. An electrode pad 62 electrically connected to the exposed part of the wiring layer 40 may be formed. In the case that a plurality of electrode pads 62 and a plurality of second connection terminals 66 are provided, the electrode pads 62 and the second connection terminals 66 may be formed to have different pitches.

The interposer 120 may be turned over to be mounted on a package substrate 200. The package substrate 200 may be formed of a flexible printed circuit board, a rigid printed circuit board, or a combination where a circuit pattern 204 is formed in its inside. The circuit pattern 204 may be connected to a bonding pad 202 or a ball pad 206 exposed to the outside.

The interposer 120 may be electrically connected to the bonding pad 202 through the second connection terminal 66 and may be connected to an external connection terminal 208 through the circuit pattern 204 of the package substrate 200.

Another semiconductor device 130 may be stacked on the interposer 120. The other semiconductor device 130 may be electrically connected to the electrode pad 62 of the interposer 120 through a first connection terminal 64. For instance, the other semiconductor device 130 may be a semiconductor chip, and the first connection terminal 64 may be a flip-chip bump. In the case that multiple first connection terminals 64 and TSVs 20 are formed, a distance between the first connection terminals 64 may be smaller than that between the TSVs 20. In the case that the distance between the first connection terminals 64 is so small that the other semiconductor device 130 cannot be directly connected to the bonding pad 202 of the package substrate 200, the interposer 120 including the first wiring layer 40 may be disposed between the other semiconductor device 130 and the package substrate 200.

A protector 80 covering parts of or all of the package substrate 200, the interposer 120, and the other semiconductor device 130 may be further included. For instance, the protector 80 may be an underfill filling at least a portion of a space between the interposer 120 and the package substrate 200 or a space between the interposer 120 and the other semiconductor device 130, or it may be a molding structure covering the interposer 120 and the other semiconductor device 130. The molding structure may include epoxy molding compound.

Figure 35:
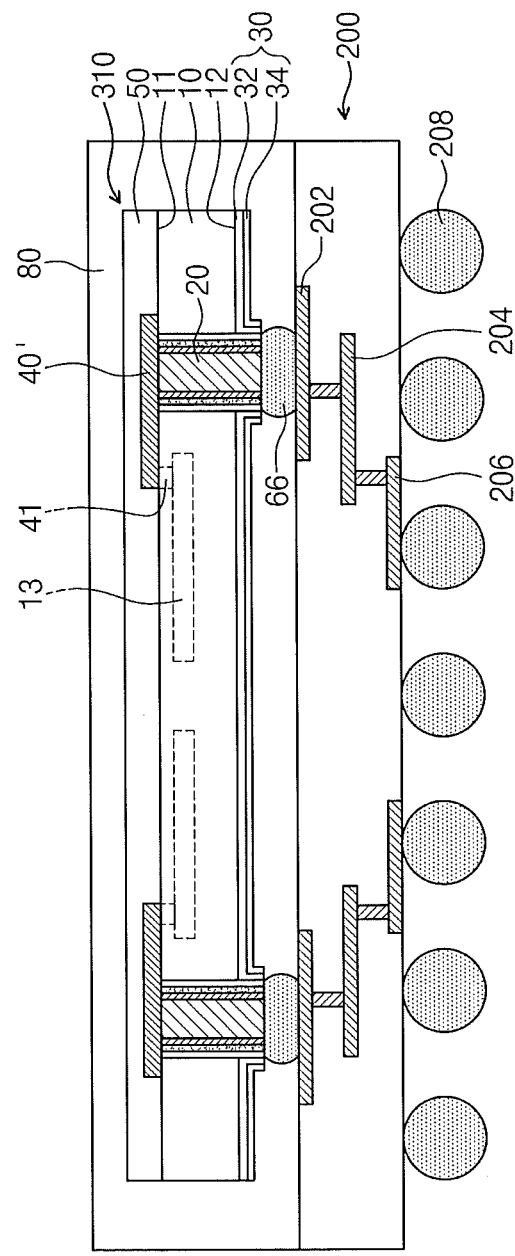
FIGS. 35 and 36 are cross-sectional views illustrating a semiconductor package and its modification according to the embodiments of the inventive concept.
Figure 36:
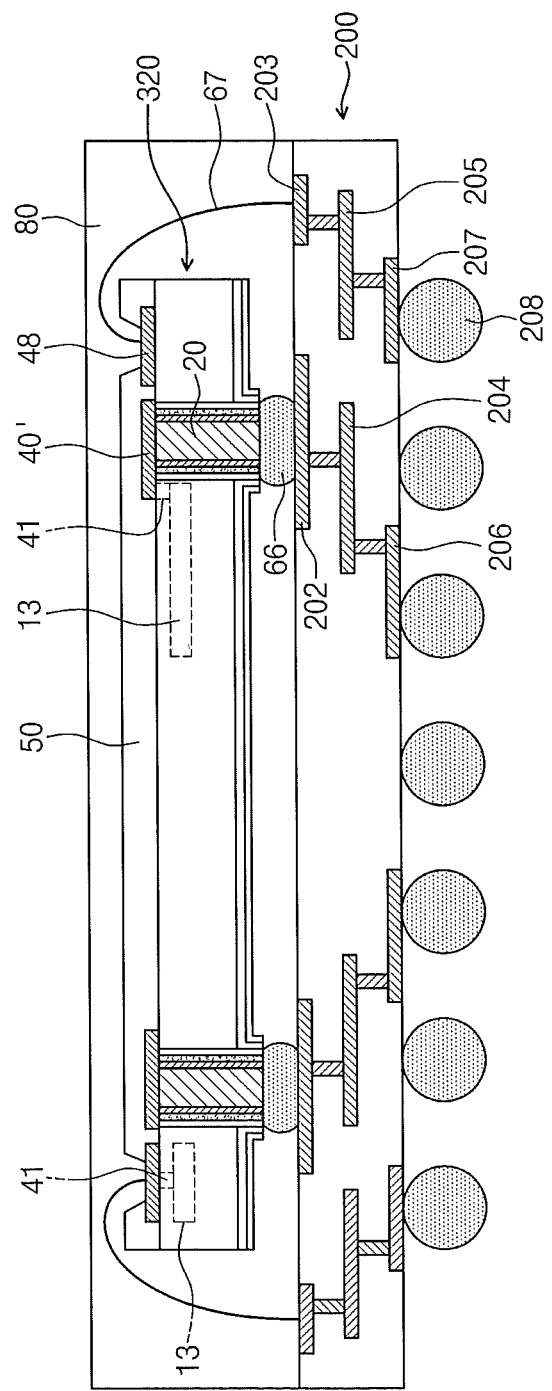

FIGS. 35 and 36 are cross-sectional views illustrating a semiconductor package and its modification according to the embodiments of the inventive concept.

Referring to FIG. 35, the semiconductor package according to the inventive concept is described. The embodiment described referring to FIG. 33 may be applied to a semiconductor chip 310. The semiconductor chip 310 may include the integrated circuit 13 inside of the semiconductor substrate 10 or on the first surface 11 of the semiconductor substrate 10. The integrated circuit 13 may be electrically connected to the TSV 20 through the internal wiring 41 and a first wiring layer 40'.

The second insulation layer 50 may be formed on the first wiring layer 40'. The first wiring layer 40' and the second insulation layer 50 may have the same structures as above-described referring to FIG. 33.

The package substrate 200 may be formed of flexible printed circuit board, rigid printed circuit board, or combination where the circuit pattern 204 is formed in its inside. The package substrate 200 may include the bonding pad 202 and the ball pad 206 exposed to the outside from both surfaces of the package substrate 200. The circuit pattern 204 may be connected to the exposed bonding pad 202 and/or the ball pad 206. The semiconductor chip 310 may be mounted on the package substrate 200 so that the second surface 12 of the semiconductor substrate 10 faces the package substrate 200. The semiconductor chip 310 may be electrically connected to the bonding pad 202 through the second connection terminal 66 and may be connected to the external connection terminal 208 through the circuit pattern 204 and the ball pad 206 of the package substrate 200.

The semiconductor chip 310 may be mounted on the package substrate 200 so that the first surface 11 of the semiconductor substrate 10 faces the package substrate 200. The second insulation layer 50 may be formed so that at least a part of the first wiring layer 40' is exposed. The exposed part of the first wiring layer 40' may be electrically connected to the circuit pattern 204 of the package substrate 200 through a connection terminal (not illustrated).

Referring to FIG. 36, the modification of the semiconductor package described referring to FIG. 35 will be described. For convenience, explanations for the same structures as FIG. 35 are omitted and differences will be described in detail. The package substrate 200 may include a second circuit pattern 205 in its inside, a second bonding pad 203 and a second ball pad 207 exposed to the outside from both surfaces of the package substrate 200, The second circuit pad 205 may be connected to the exposed second bonding pad 203 and/or the second ball pad 207.

A part of the integrated circuit 13 of a semiconductor chip 320 may be electrically connected to the TSV 20 through the internal wiring 41 and the first wiring layer 40'. Another part of the integrated circuit 13 of the semiconductor chip 320 may be electrically connected to a bonding wire 67 through the internal wiring 41 and a second wiring layer 48. The first and second wiring layers 40' and 48 and the second insulation layer 50 may have the same structures as above-described referring to FIG. 33. A part of the second wiring layer 48 may be exposed by the second insulation layer 50 to be connected to the bonding wire 67. The semiconductor chip 320 may be electrically connected to the second circuit pattern 205 of the package substrate 200 through the bonding wire 67 and may be connected to the external connection terminal 208 through the second ball pad 207.

A signal transferred through the TSV 20 may be different from a signal transferred through the bonding wire 67. For instance, the TSV 20 may transfer a power or ground signal, and the bonding wire 67 may transfer a data signal. On the contrary, the TSV 20 may transfer the data signal, and the bonding wire 67 may transfer the power or ground signal. Accordingly, the semiconductor chip 320 may have more signal transfer paths.

Figure 37:
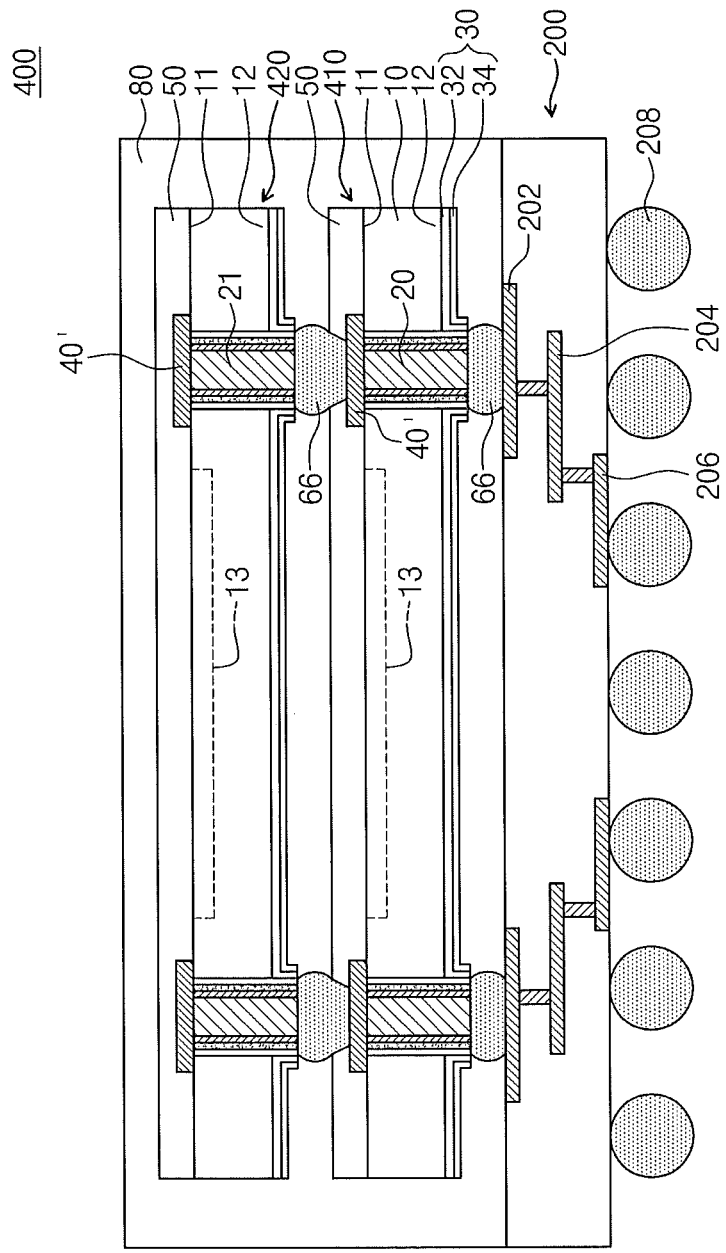
FIGS. 37 to 39 are cross-sectional views illustrating a semiconductor package and its modifications according to the embodiments of the inventive concept.
Figure 38:
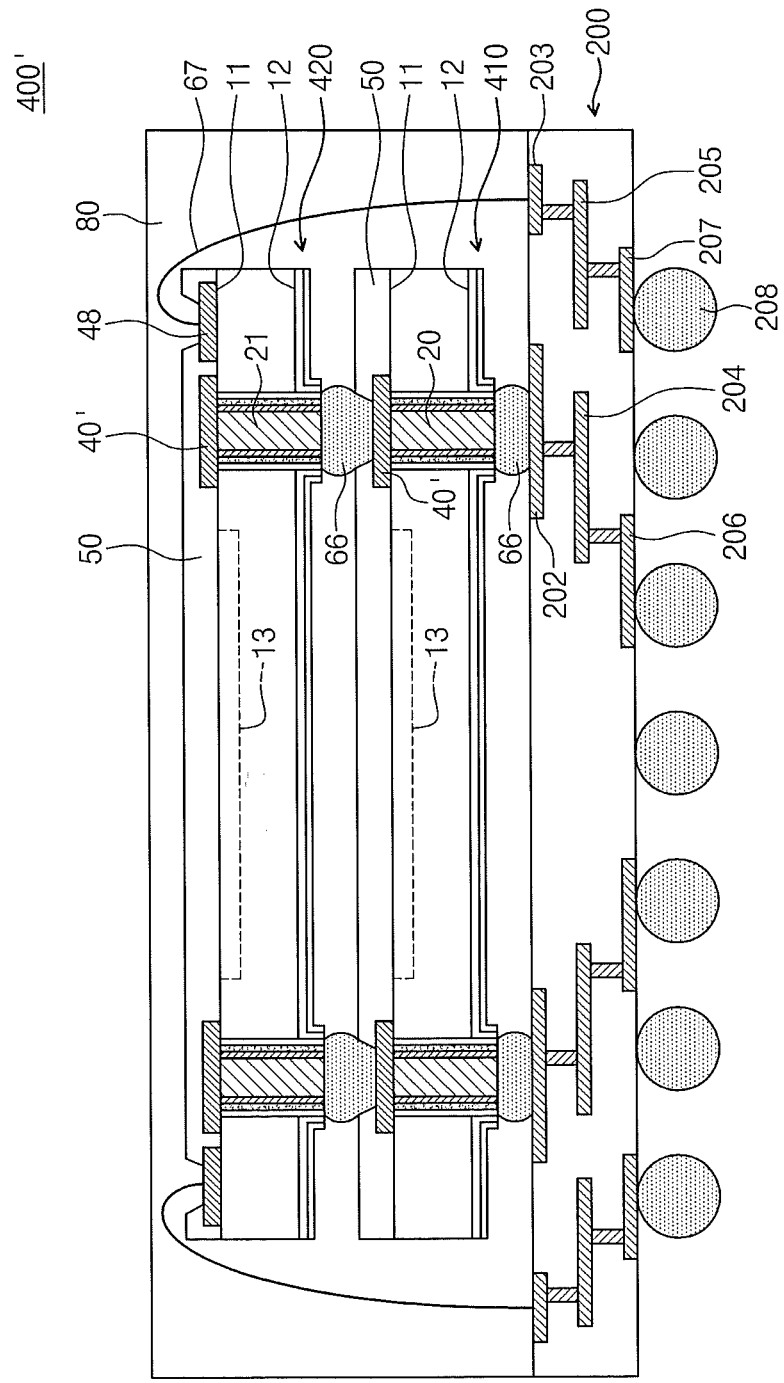
Figure 39:
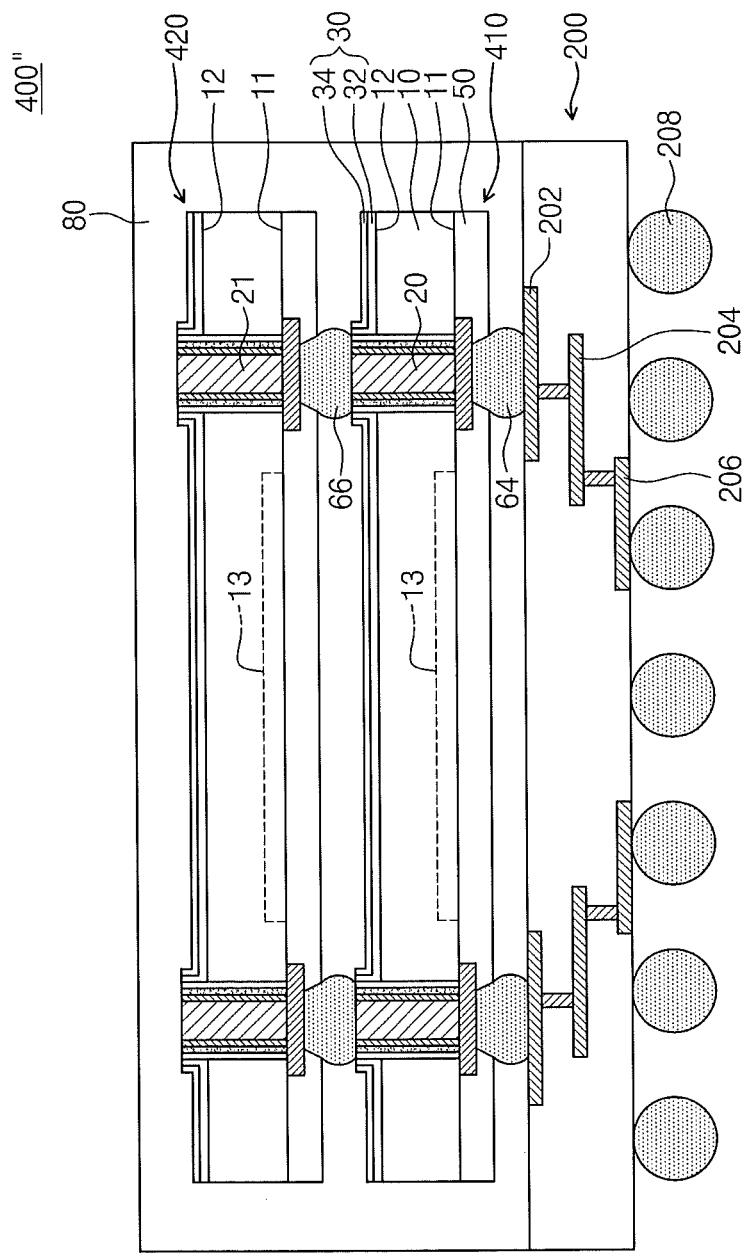

FIGS. 37 to 39 are cross-sectional views illustrating a semiconductor package and its modifications according to the embodiments of the inventive concept. For convenience, explanations for the same structures as FIGS. 35 and 36 are omitted and differences will be described in detail.

Referring to FIG. 37, a multi-chip package 400 according to the inventive concept will be described. The embodiment described referring to FIG. 33 may be applied to semiconductor chips 410 and 420 of the multi-chip package 400. The multi-chip package 400 may include a package substrate 200, a first semiconductor chip 410 on the package substrate 200, and at least one second semiconductor chip 420 on the first semiconductor chip 410. The first semiconductor chip 410 and the second semiconductor chip 420 may be the same kind of semiconductor chip. For instance, the first semiconductor chip 410 and the second semiconductor chip 420 may be fabricated through the same process. Each of the first semiconductor chip 410 and the second semiconductor chip 420 may include an integrated circuit 13 where the memory circuit is formed. The first semiconductor chip 410 and the second semiconductor chip 420 may include a first TSV 20 and a second TSV 21 respectively. The first TSV 20 and the second TSV 21 may be overlapped with each other to be connected. The second TSV 21 may be directly connected to the first TSV 20. Otherwise, the first TSV 20 and the second TSV 21 may be connected to each other through the first wiring layer 40, the connection pad (62 of FIG. 34), and/or the second connection terminal 66 between them.

Referring to FIG. 38, a semiconductor package 400' according to a modification of the semiconductor package 400 described referring to FIG. 37 will be described. For convenience, explanations for the same structures as FIG. 37 are omitted and differences will be described in detail.

The first semiconductor chip 410 and the second semiconductor chip 410 may respectively include the first TSV 20 and the second TSV 21. The first TSV 20 and the second TSV 21 may be overlapped with each other to be connected. A part of the integrated circuit 13 of the second semiconductor chip 420 may be electrically connected to the second TSV 21 through the internal wiring and the first wiring layer 40'. Another part of the integrated circuit 13 of the second semiconductor chip 420 may be electrically connected to the bonding wire 67 through the internal wiring and the second wiring layer 48. The first wiring layer 40' and first insulation layer 50 may have the same or similar structures as above-described referring to FIG. 33. A part of the second wiring layer 48 may be exposed by the second insulation layer 50 to be connected to the bonding wire 67. The second semiconductor chip 420 may be electrically connected to the second circuit pattern 205 of the package substrate 200 through the bonding wire 67.

The signal transferred through the TSVs 20 and 21 may be different from the signal transferred through the bonding wire 67. For instance, the TSVs 20 and 21 may transfer the power or ground signal, and the bonding wire 67 may transfer the data signal. On the contrary, the TSVs 20 and 21 may transfer the data signal, and the boding wire 67 may transfer the power or ground signal. Therefore, the semiconductor chips 410 and 420 may have more signal transfer paths.

Referring to FIG. 39, a semiconductor package 400" according to another modification of the semiconductor package 400 described referring to FIG. 37 will be described. For convenience, explanations for the same structures as FIG. 37 are omitted and differences will be described in detail. The first semiconductor chip 410 and the second semiconductor chip 420 may be mounted on the package substrate 200 so that their first surfaces 11 face the package substrate 200. The first semiconductor chip 410 may be connected to the bonding pad 202 of the package substrate 200 through the connection terminal 64 on the first surface 11 of the first semiconductor chip 410.

Figure 40:
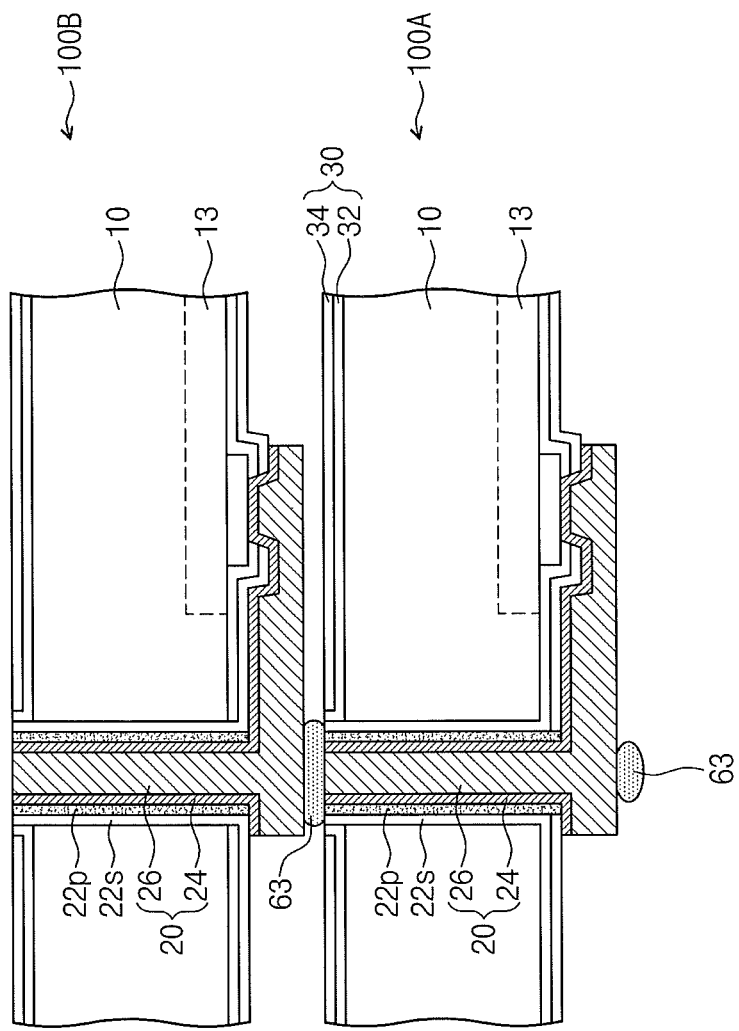
FIG. 40 is a cross-sectional view illustrating a semiconductor package according to the embodiments of the inventive concept.

FIG. 40 is a cross-sectional view illustrating a semiconductor package where the semiconductor devices according to the embodiments of the inventive concept are stacked.

Referring to FIG. 40, a first semiconductor device 100A and a second semiconductor device 100B are stacked so that their TSVs 20 are vertically aligned. The TSV 20 of the first semiconductor device 100A and the TSV 20 of the second semiconductor device 100B may be joined through the connector 63. A gap between the first semiconductor device 100A and the second semiconductor device 100B may be filled with an insulating filler (not illustrated).

The stacked semiconductor devices may be mounted on the package substrate (200 of FIG. 39). For the package substrate (200 of FIG. 39), the printed circuit board, tape wiring board, ceramic wiring board, or silicon wiring board may be used. The package substrate (200 of FIG. 39) may include the wiring pattern (204 of FIG. 39) extended onto one surface of the package substrate (200 of FIG. 39) penetrating the package substrate (200 of FIG. 39), the bonding pad (202 of FIG. 39) formed on the one surface of the package substrate (200 of FIG. 39) and electrically connected to the wiring pattern (204 of FIG. 39), and the ball pad (206 of FIG. 39) formed on the other surface of the package substrate (200 of FIG. 39) and electrically connected to the wiring pattern (204 of FIG. 39). For mounting the semiconductor device 100A or 100B or semiconductor devices where they are stacked on the package substrate (200 of FIG. 39), the connector 63 of the semiconductor device 100A may be joined with the bonding pad (202 of FIG. 39) of the package substrate (200 of FIG. 39).

Figure 41:
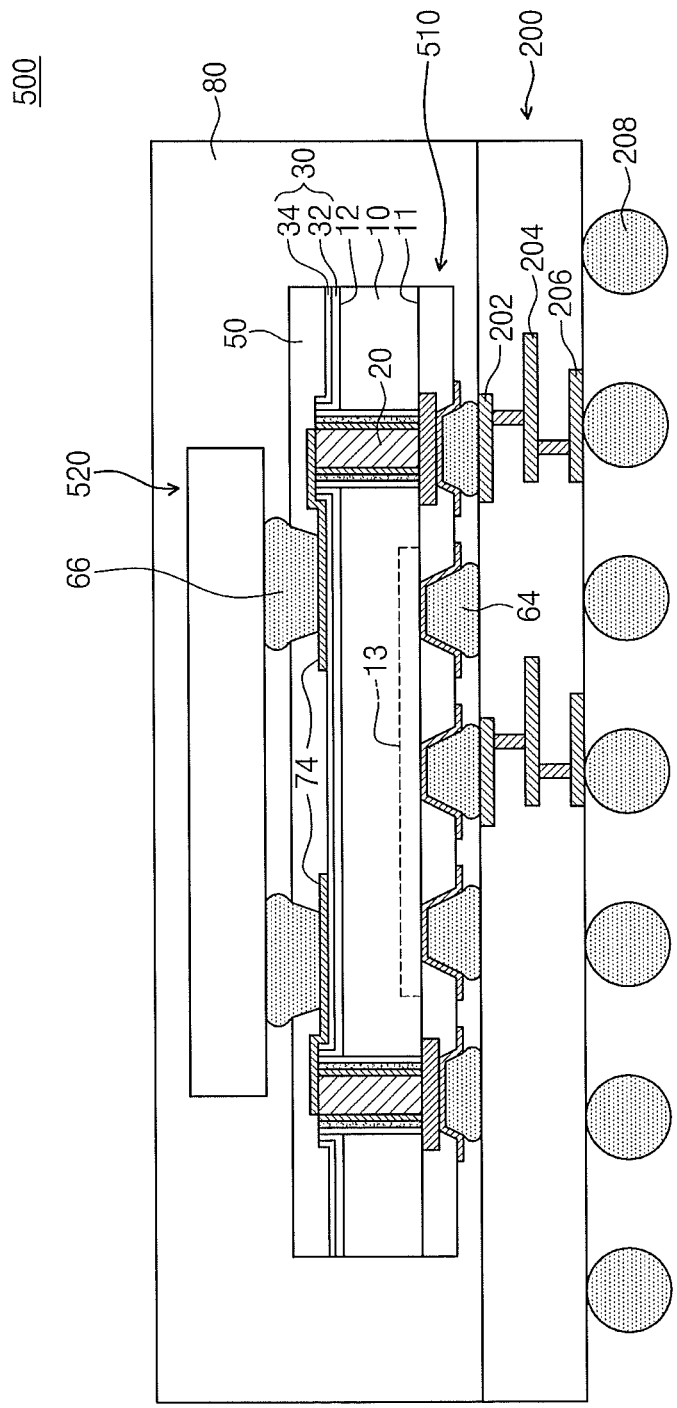
FIGS. 41 and 42 are cross-sectional views illustrating a semiconductor package and its modification according to the embodiments of the inventive concept.
Figure 42:
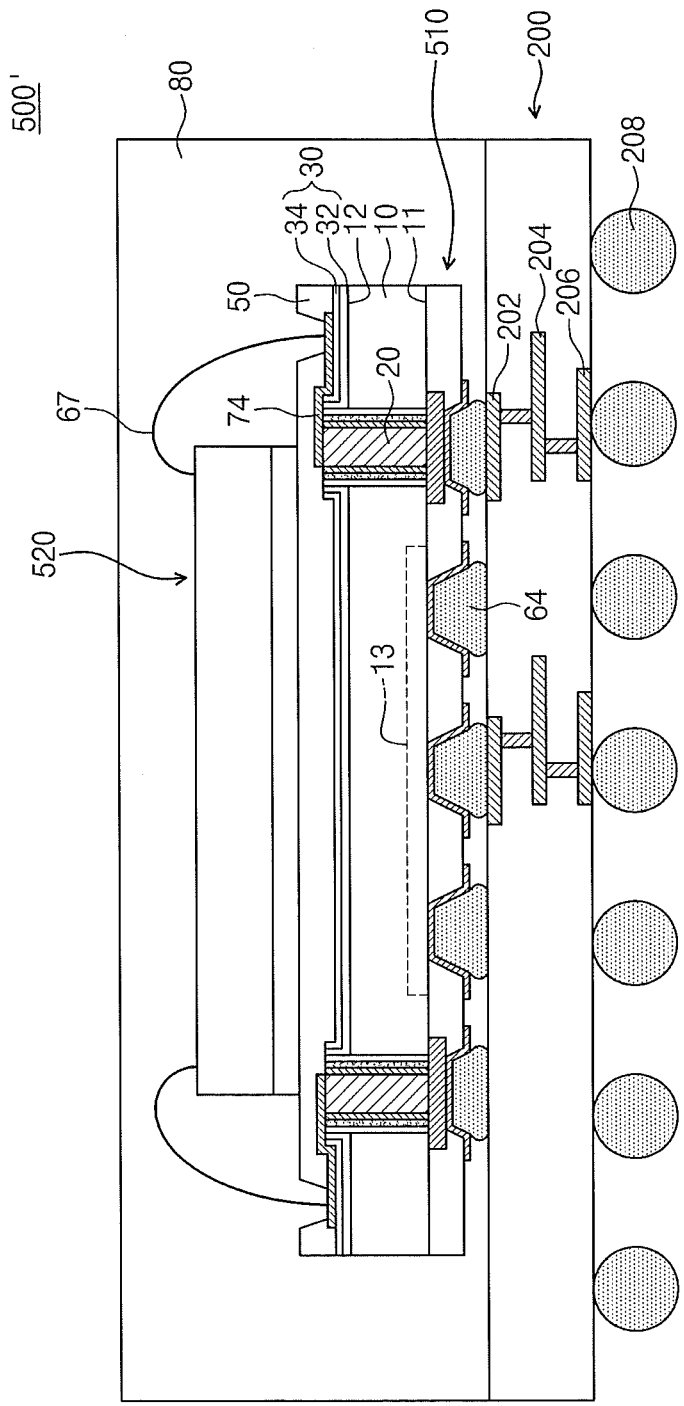

FIGS. 41 and 42 are cross-sectional views illustrating a semiconductor package and its modification according to the embodiments of the inventive concept. For convenience, explanations for the same structures as FIGS. 35 and 36 are omitted and differences will be described in detail.

Referring to FIG. 41, a semiconductor package 500 according to the embodiment may be a system in package 500. The embodiment described referring to FIG. 33 may be applied to a first semiconductor chip 510 of the system in package 500. A second semiconductor chip 520 may be stacked on the first semiconductor chip 510. The second semiconductor chip 520 may be a different kind of semiconductor chip from the first semiconductor chip 510. For instance, the first semiconductor chip 510 may include the logic circuit, and the second semiconductor chip 520 may include the memory circuit. The second semiconductor chip 520 may be a high-performance memory chip for helping operations of the first semiconductor chip 510.

The first semiconductor chip 510 may be mounted on the package substrate 200 so that its first surface 11 faces the package substrate 200. The first semiconductor chip 510 may further include a plurality of first connection terminals 64 on its first surface 11. Some of the first connection terminals 64 may be connected to the TSV 20 and the others may be connected to the integrated circuit 13 formed at the first semiconductor chip 510. The integrated circuit 13 may be directly connected to the package substrate 200 through the first connection terminal 64. The integrated circuit 13 may be connected to the second semiconductor chip 520 through the TSV 20.

The second semiconductor chip 520 may be connected to the package substrate 200 through the TSV 20 and the first connection terminal 64. The second semiconductor chip 520 may be connected to the first semiconductor chip 510 through the second connection terminal 66 on one surface of the second semiconductor chip 520. The second connection terminal 66 may be selected from the list including a conductive bump, solder ball, conductive spacer, and PGA. The second connection terminal 66 and the TSV 20 may be connected to each other through a fifth wiring pattern 74 for rewiring. For instance, when a distance between the second connection terminals 66 is different from that between the TSVs 20, the fifth wiring pattern 74 may be used for connecting them.

Referring to FIG. 42, a semiconductor package 500' according to a modification of the semiconductor package 500 described referring to FIG. 41 will be described. For convenience, explanations for the same structures as FIG. 41 are omitted and differences will be described in detail.

A part of the fifth wiring pattern 74 may be exposed by the second insulation layer 50. The second semiconductor chip 520 may be electrically connected to the fifth wiring pattern 74 through the bonding wire 67. The first semiconductor chip 510 and the second semiconductor chip 520 may be connected to each other through the bonding wire 67. The bonding wire 67 may be directly connected to the TSV 20 or may be connected to the TSV 20 through the fifth wiring pattern 74 for rewiring.

Figure 43:
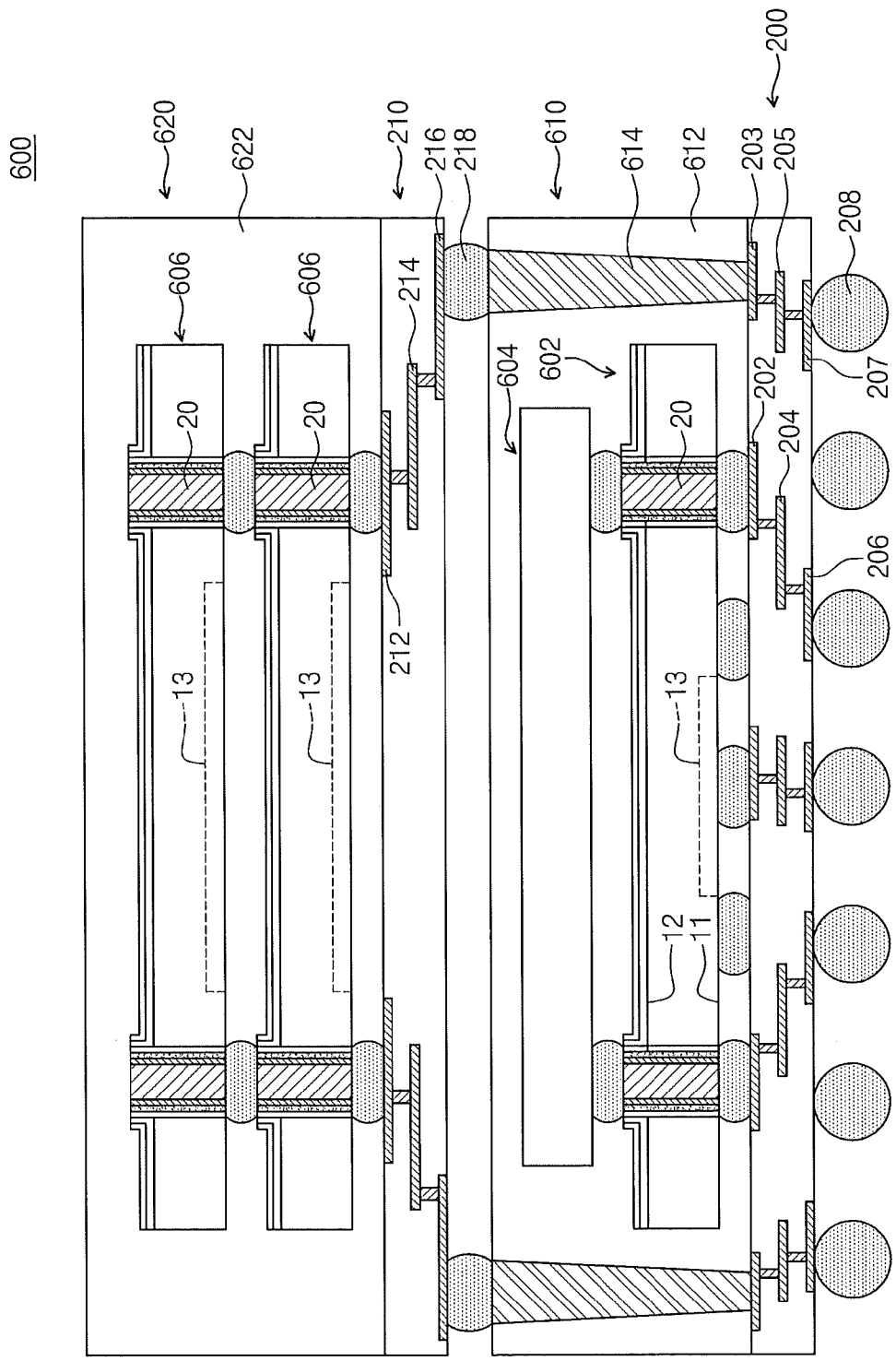
FIG. 43 is a cross-sectional view illustrating a semiconductor package according to the embodiments of the inventive concept.

FIG. 43 is a cross-sectional view illustrating a semiconductor package according to the embodiments of the inventive concept.

Referring to FIG. 43, the embodiments described referring to FIGS. 34 to 42 may be applied to a first semiconductor package 610 and/or a second semiconductor package 620 of a stacked package 600.

The first semiconductor package 610 may include a first semiconductor chip 602 on a first package substrate 200. The embodiment described referring to FIG. 33 may be applied to the first semiconductor chip 602. The first semiconductor package 610 may further include a protector 612 covering the first semiconductor chip 602 and at least a part of the first package substrate 200. For instance, the protector 612 may be an underfill between the first surface 11 of the first semiconductor chip 602 and the first package substrate 200, or it may be a molding structure further covering other surfaces of the first semiconductor chip 602, and may include an epoxy molding compound. In the case that the protector 612 is a molding structure, the first semiconductor package 610 may further include a molding electrode 614 penetrating the molding structure. One end of the molding electrode 614 may be connected to the second circuit pattern 205 of the first package substrate 200, and the other end may be exposed to the outside of the protector 612. The first semiconductor package 610 may further include a second semiconductor chip 604 on the first semiconductor chip 602.

The second semiconductor package 620 may be stacked on the first semiconductor package 610. The second semiconductor package 620 may include a second package substrate 210 and at least one third semiconductor chip 606 on the second package substrate 210. For instance, the at least one third semiconductor chip 606 may be a high-capacity memory chip and may be connected to each other through each TSV 20. The second package substrate 210 may include an external connection terminal 218 on a surface facing the first semiconductor package 610. The external connection terminal 218 may be connected to the exposed surface of the molding electrode 614. The second semiconductor package 620 may be connected to the outside through a third circuit pattern 214 of the second package substrate 210, the external connection terminal 218, the molding electrode 614 and the second circuit pattern 205 of the first package substrate 200. The second circuit pattern 205 of the first package substrate 200 may be electrically separated from the first circuit pattern 204 connected to the first semiconductor chip 602. Since the first semiconductor package 610 and the second semiconductor package 620 which function differently may be vertically stacked, a mounting size may be reduced compared to individually mounting them on a module board (702 of FIG. 46) at the following process. The second semiconductor package 620 may further include a protector 622 covering the second package substrate 210 and at least a part of the third semiconductor chip 606. For instance, the protector 622 may mold the at least one third semiconductor chip 606 or may be underfills between a lowermost third semiconductor chip 606 and the second package substrate 210.

Figure 44:
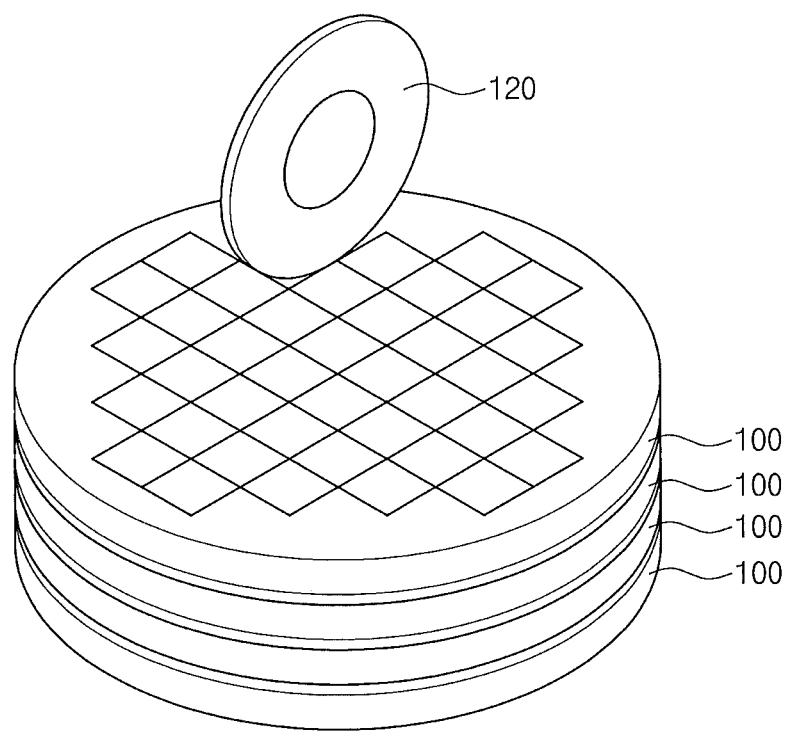
FIGS. 44 and 45 are diagrams for explaining a method of fabricating the semiconductor package according to the embodiments of the inventive concept.
Figure 45:
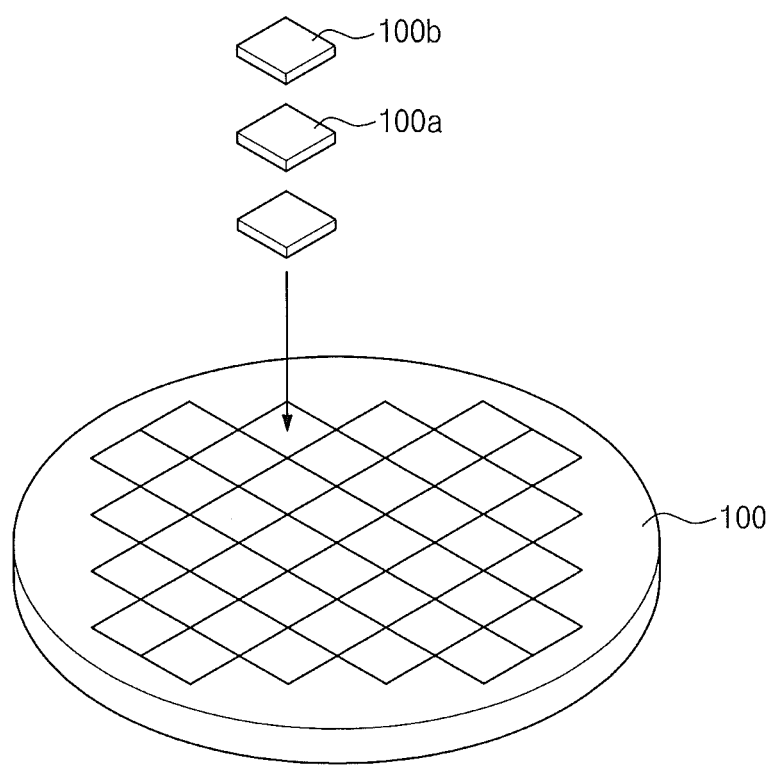

FIGS. 44 and 45 are diagrams for explaining a method of fabricating the semiconductor package according to the embodiments of the inventive concept.

Referring to FIG. 44, semiconductor wafers 100 where the semiconductor devices obtained through the fabricating methods illustrated in FIGS. 11 to 32 may be provided. A plurality of semiconductor wafers 100 may be stacked. By stacking the plurality of semiconductor wafers 100 and cutting the plurality of semiconductor wafers 100 along the scribe lane, they may be separated into individual semiconductor packages. The cutting may be performed by using a cutter 120 or laser.

Otherwise, as illustrated in FIG. 45, the semiconductor package may be formed by stacking individual semiconductor devices 100a, 100b and so forth on the semiconductor wafer 100. Or, after the individual semiconductor devices 100a, 100b and so forth are separated by cutting along the scribe lane, the semiconductor package may be formed by stacking the plurality of semiconductor devices 100a 100b and so forth.

Figure 46:
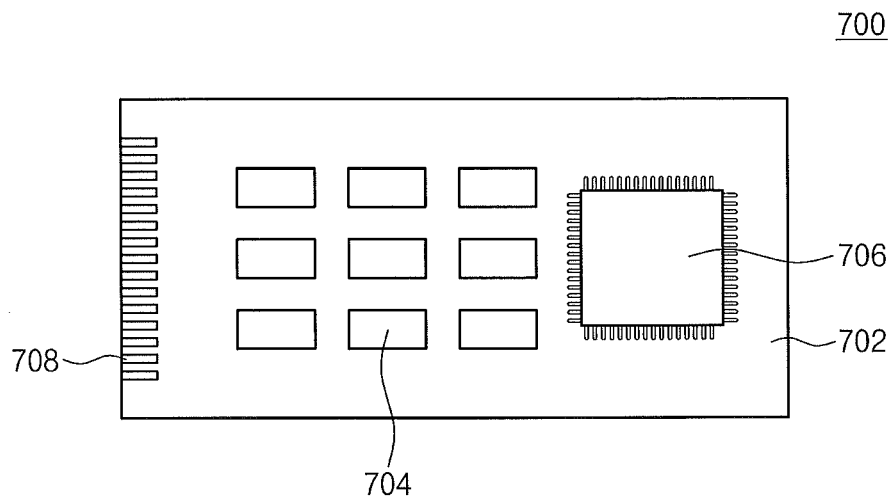
FIG. 46 is a plane view illustrating a package module according to the embodiments of the inventive concept.

FIG. 46 is a plane view illustrating a package module 700 according to the embodiments of the inventive concept.

Referring to FIG. 46, the package module 700 may include a module substrate 702 provided with an external connection terminal 708, a semiconductor chip 704 mounted on the module substrate 702, and a semiconductor package 706 which is Quad Flat Packaged (QFP). The semiconductor chip 704 and/or the semiconductor package 706 may include the semiconductor device according to the embodiment of the inventive concept. The package module 700 may be connected to an external electronic device through the external connection terminal 708.

Figure 47:
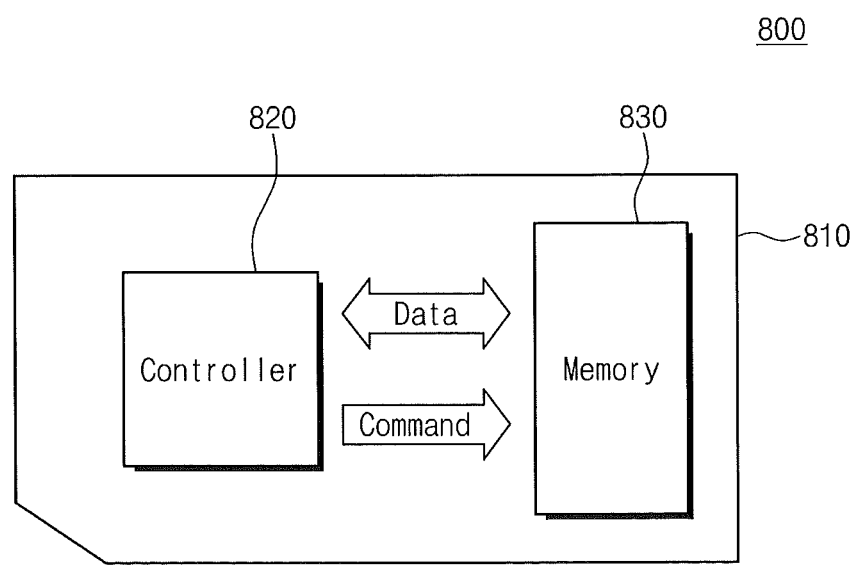
FIG. 47 is a block diagram illustrating a memory card according to the embodiments of the inventive concept.

FIG. 47 is a schematic diagram illustrating a memory card 800 according to the embodiments of the inventive concept.

Referring to FIG. 47, the memory card 800 may include a controller 820 and a memory 830 within a housing 810. The controller 820 and the memory 830 may exchange electric signals. For instance, according to a command of the controller 820, the memory 830 and the controller 820 may exchange data. Accordingly, the memory card 800 may store the data into the memory 830 or outputs the data to the outside from the memory 830.

The controller 820 and/or the memory 830 may include at least one of the semiconductor device or the semiconductor package according to the embodiments of the inventive concept. For instance, the controller 820 may include the system in package (500 of FIG. 41 or 500' of FIG. 42), and memory 830 may include the multi-chip package (400 of FIG. 37, 400' of FIG. 38, or 400" of FIG. 39). Or, the controller 820 and/or the memory 830 may be provided as the stacked package (600 of FIG. 43). The memory card 830 may be used as a storage medium of various portable devices. For instance, the memory card 830 may include a Multi Media Card (MMC) or a Secure Card (SD).

Figure 48:
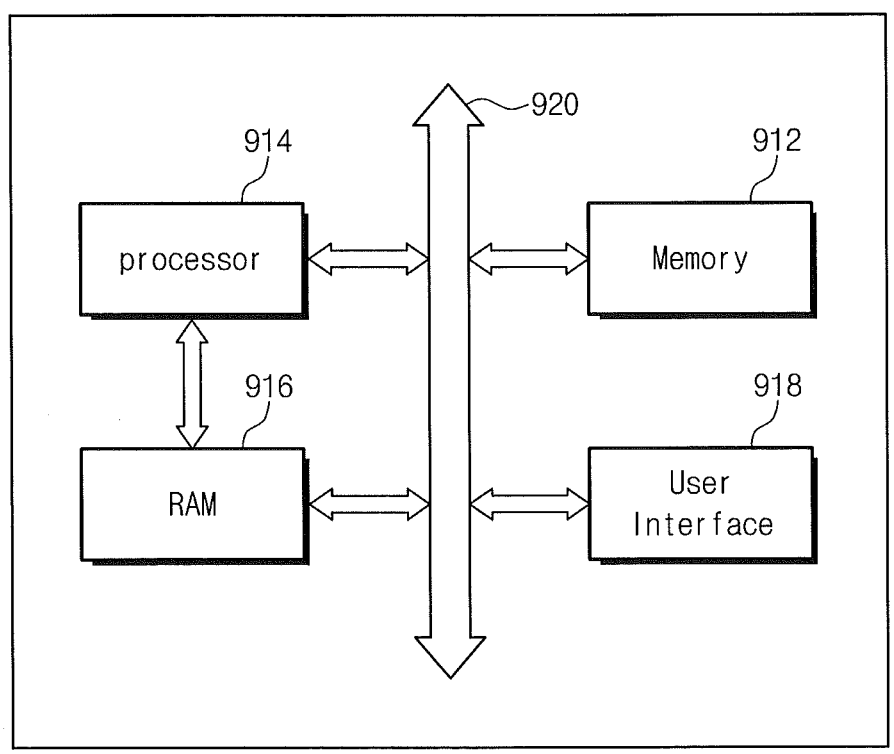
FIG. 48 is a block diagram illustrating an electronic system according to the embodiments of the inventive concept.

FIG. 48 is a block diagram illustrating an electronic system 900 according to the embodiments of the inventive concept.

Referring to FIG. 48, the electronic system 900 may include at least one of the semiconductor device or the semiconductor package according to the embodiments of the inventive concept. The electronic system 900 may include a mobile device, a computer or the like. For instance, the electronic system 900 may include a memory system 912, a processor 914, a RAM 916, and a user interface 918. Herein, they may perform data communication by using a bus 920. The processor 914 may serve to run a program and control the electronic system 900. The RAM 916 may be used an operating memory of the processor 914. For instance, each of the processor 914 and the RAM 914 may include the semiconductor devices or the semiconductor package according to the embodiments of the inventive concept. Or, the processor 914 and the RAM 916 may be included one package. The user interface 918 may be used for inputting or outputting data to or from the electronic system 900. The memory system 912 may store a code for operating the processor 914, data processed by the processor 914 or data inputted from the outside. The memory system 912 may include the controller and the memory and may be configured as the same as the memory card 800 of FIG. 47 substantially.

Figure 49:
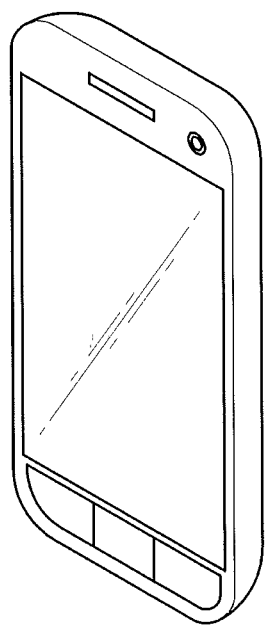
FIG. 49 is a perspective view illustrating an electronic device according to the embodiments of the inventive concept.

The electronic system 900 may be applied to an electronic control device of various electronic devices. FIG. 49 illustrates that the electronic system 900 is applied to a mobile phone 1000. Besides, the electronic system 900 may be applied to portable laptops, MP3 players, navigations, Solid State Disks (SSDs), cars, or household appliances.

As above-described, according to the inventive concept, since the structure of the TSV of the semiconductor device has the multi-layered insulation layer, electric characteristics and reliability of the semiconductor device may be improved.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device, comprising:
a substrate; and
a stacked insulation layer on a sidewall of an opening which penetrates the substrate,
wherein the stacked insulation layer comprises at least one first insulation layer and at least one second insulation layer whose dielectric constant is different from that of the first insulation layer, wherein one insulation layer comprises a polymer and the other comprises a silicon based dielectric, and wherein a thickness of the first insulation layer at an upper part of the opening is smaller than a thickness of the first insulation layer at a lower part of the opening and a thickness of the second insulation layer at a lower part of the opening is smaller than a thickness of the second insulation layer at the upper of the opening.

2. The semiconductor device of claim 1, wherein the second insulation layer comprises a CF-based polymer.

3. The semiconductor device of claim 1, wherein the first insulation layer comprises at least one material selected from the list including silicon oxide, silicon oxinitride, or silicon nitride.

4. The semiconductor device of claim 1, further comprising a conductor substantially filling an opening in the stacked insulation layer.

5. The semiconductor device of claim 4, further comprising a barrier layer between the conductor and the stacked insulation layer.

6. The semiconductor device of claim 4, further comprising a conductive region electrically connected to the conductor at a bottom surface of the opening.

7. The semiconductor device of claim 1, wherein the stacked insulation layer has a constant thickness from the upper part to the lower part of the opening.

8. The semiconductor device of claim 1, wherein the thickness of the first insulation layer gradually increases from an upper surface to a lower surface of the substrate.

9. The semiconductor device of claim 1, wherein the thickness of the second insulation layer gradually decreases from an upper surface to a lower surface of the substrate.

10. The semiconductor device of claim 1, wherein the first insulation layer comprises a first portion having a constant thickness and a second portion having a gradually decreasing thickness from a lower surface of the substrate.

11. The semiconductor device of claim 1, wherein the second insulation layer comprises a first portion having a constant thickness and a second portion having a gradually increasing thickness from a lower surface of the substrate.

12. A semiconductor device, comprising:
a substrate including an opening penetrating the substrate; and
a stacked insulation layer on a sidewall of the opening, wherein the stacked insulation layer comprises a first insulation layer comprising a polymer and a second insulation layer comprising a silicon based dielectric, and wherein one of the first and second insulation layers has a thickness gradually increasing from an upper surface to a lower surface of the substrate.

13. The semiconductor device of claim 12, wherein another of the first and second insulation layers has a thickness gradually decreasing from the upper surface to the lower surface of the substrate.

14. The semiconductor device of claim 12, wherein the stacked insulation layer has a constant thickness from the upper surface to the lower surface of the substrate.

* * * * *